US012701899B2

(12) United States Patent
Son et al.

(10) Patent No.: US 12,701,899 B2
(45) Date of Patent: Aug. 4, 2026

(54) DISPLAY DEVICE AND MANUFACTURING METHOD THEREOF

(71) Applicant: SAMSUNG DISPLAY CO., LTD., Yongin-si (KR)

(72) Inventors: Younghye Son, Yongin-si (KR); Seul-Gi Kim, Yongin-si (KR)

(73) Assignee: SAMSUNG DISPLAY CO., LTD., Yongin-si (KR)

( * ) Notice: Subject to any disclaimer, the term of this patent is extended or adjusted under 35 U.S.C. 154(b) by 340 days.

(21) Appl. No.: 18/534,377

(22) Filed: Dec. 8, 2023

(65) Prior Publication Data

US 2024/0244922 A1 Jul. 18, 2024

(30) Foreign Application Priority Data

Jan. 17, 2023 (KR) ........................ 10-2023-0006463

(51) Int. Cl.
| | |
|---|---|
| *H10K 59/80* | (2023.01) |
| *C09J 5/00* | (2006.01) |
| *C09J 9/02* | (2006.01) |
| *C09J 201/00* | (2006.01) |

(52) U.S. Cl.
CPC ................ *H10K 59/80* (2023.02); *C09J 5/00* (2013.01); *C09J 9/02* (2013.01); *C09J 201/00* (2013.01)

(58) Field of Classification Search
CPC ...... H10K 59/80; H10K 77/111; G09F 9/301; C09J 9/02; C09J 201/00; C09J 2203/318
USPC ....................................................... 361/748
See application file for complete search history.

(56) References Cited

U.S. PATENT DOCUMENTS

| | | | |
|---|---|---|---|
| 10,725,498 | B2 | 7/2020 | Han et al. |
| 10,743,428 | B2 | 8/2020 | Cho |
| 11,557,740 | B2 | 1/2023 | An et al. |
| 2022/0011814 | A1 | 1/2022 | Ryou et al. |
| 2022/0288893 | A1 | 9/2022 | Joshi et al. |
| 2023/0096985 | A1 | 3/2023 | Chen |

FOREIGN PATENT DOCUMENTS

| | | |
|---|---|---|
| KR | 10-2019-0040518 | 4/2019 |
| KR | 10-2020-0084980 | 7/2020 |
| KR | 10-2021-0101343 | 8/2021 |

(Continued)

OTHER PUBLICATIONS

Examination report Mar. 18, 2024 from the WO Patent Office corresponding to the WO Patent Application(PCT/KR2023/020418).

*Primary Examiner* — Tremesha W Burns
(74) *Attorney, Agent, or Firm* — F. CHAU & ASSOCIATES, LLC

(57) ABSTRACT

A display device includes a display module including first, second, and third regions arranged in a first direction, a first support layer that includes hole groups spaced apart from each other in the first direction and is disposed under the display module to overlap the first region, a first adhesive layer disposed between the first region and the first support layer, a second support layer disposed under the display module to overlap the second region, a second adhesive layer disposed between the second region and the second support layer, and multi-bars disposed under the first support layer and spaced apart from each other in the first direction. The first adhesive layer includes at least one first resin layer, and second resin layers. Each of the second resin layers overlap a corresponding hole group and having a higher modulus than the first resin layer.

16 Claims, 16 Drawing Sheets

(56)         References Cited

FOREIGN PATENT DOCUMENTS

| KR | 10-2022-0007752 | 1/2022 |
| KR | 10-2022-0042459 | 4/2022 |
| KR | 10-2022-0068132 | 5/2022 |
| KR | 10-2022-0091330 | 6/2022 |
| WO | 2021-147709 | 7/2021 |

DISPLAY DEVICE AND MANUFACTURING METHOD THEREOF

CROSS-REFERENCE TO RELATED APPLICATIONS

This U.S. non-provisional patent application claims priority under 35 U.S.C. § 119 to Korean Patent Application No. 10-2023-0006463, filed on Jan. 17, 2023, the disclosure of which is incorporated by reference herein.

1. TECHNICAL FIELD

The present disclosure herein relates to a display device and a manufacturing method thereof, and more particularly, to a display device capable of performing a sliding operation, and a method of manufacturing the display device.

2. DISCUSSION OF RELATED ART

Display devices such as smartphones, digital cameras, notebook computers, navigation devices and smart televisions, provide a user with an image through a display screen. The display devices may include a display panel that generates the image.

Recently, with the technical development, display devices having various shapes are being developed. For example, flexible display devices that are foldable or rollable are being developed. The flexible display devices having variously changeable shapes are portable and convenient to use.

The flexible display devices include an expandible flexible display device having a portion disposed within a case or protruding outside of the case according to a folding property of the display panel. A user of the expandible flexible display device may expand its display screen as necessary. However, a structure of the expandable flexible display device that supports bending of a display panel of the expandable flexible display device is visible to a user. Thus, the quality of images perceived by a user may decrease. Further, the expandable flexible device is not as durable as a flexible display device that is not expandible.

SUMMARY

At least one embodiment of the present disclosure provides a display device that minimizes an area of the structure supporting bending of a display panel of the display device that is visible to improve image quality. The structure may have a sliding part and be simpler to manufacture.

At least one embodiment of the present disclosure provides a display device having a sliding operation (e.g., capable of being expanded/contracted) with increased durability since rigidity of its support layer prone to a deformation during the sliding operation is supplemented and/or a thickness of an adhesive layer disposed at a portion prone to a bending deformation is increased.

At least one embodiment of the present disclosure also provides a method of manufacturing a display device with reduced costs.

An embodiment of the inventive concept provides a display device including a display module including a first region, a second region, and a third region that are arranged in a first direction, a first support layer, a first adhesive layer, a second support layer, a second adhesive layer, and multi-bars. The first region, the second region, and the third region may be arranged sequentially in the first direction. The first support layer includes hole groups. Each of the hole groups includes a plurality of holes. Each of the hole groups are spaced apart from each other in the first direction. Each of the hole groups are disposed at a lower portion of the display module to overlap the first region. The first adhesive layer is disposed between the first region and the first support layer. The second support layer is disposed under the display module to overlap the second region. The second adhesive layer is disposed between the second region and the second support layer. The multi-bars are disposed below the first support layer, are spaced apart from each other in the first direction, and each of the multi-bars extends in a second direction crossing the first direction. The first adhesive layer includes at least one first resin layer, and second resin layers. Each of the second resin layers overlaps a corresponding hole group among the hole groups and has a higher modulus than the first resin layer.

In an embodiment, the first adhesive layer includes an optically clear resin (OCR), and the second adhesive layer include a pressure sensitive adhesive (PSA).

In an embodiment, each of the multi-bars is disposed between two of the hole groups of the first support layer, which are adjacent to each other in the first direction.

In an embodiment, the at least one first resin layer is in contact with a rear surface of the display module, which overlaps the first region, and each of the second resin layers extends in the second direction and the second resin layers are spaced apart from each other in the first direction.

In an embodiment, the second resin layers are disposed on a rear surface of the at least one first resin layer, and a predetermined space is present between the at least one first resin layer and the first support layer and between the second resin layers adjacent to each other.

In an embodiment, the at least one first resin layer is spaced apart from the first support layer with the second resin layers therebetween.

In an embodiment, the second resin layers are disposed in the at least one first resin layer, and a rear surface of the at least one first resin layer and a rear surface of each of the second resin layers, which is exposed on the rear surface of the at least one first resin layer, is in contact with the first support layer.

In an embodiment, the at least one first resin layer is provided in plurality, each of the first resin layers extend in the second direction, the first resin layers are spaced apart from each other in the first direction and overlap corresponding multi-bars, respectively, among the multi-bars, and each of the second resin layers are disposed between the first resin layers adjacent to each other.

In an embodiment, each of the first resin layers and the second resin layers have a first surface in contact with a rear surface of the display module, a second surface in contact with the first support layer, and side surfaces, each of which connects the first surface and the second surface to each other. Each of the first resin layers and the second resin layers may have a trapezoidal shape in a cross-sectional view.

In an embodiment, the first surface of each of the first resin layers has a width smaller than a width of the second surface of each of the first resin layers in a cross-sectional view, and the first surface of each of the second resin layers has a width greater than a width of the second surface of each of the second resin layers in a cross-sectional view.

In an embodiment, the first surface of each of the first resin layers has a width greater than a width of the second surface of each of the first resin layers in a cross-sectional view, and the first surface of each of the second resin layers has a width smaller than a width of the second surface of each of the second resin layers in a cross-sectional view.

In an embodiment, the first region of the display module, the first adhesive layer, and the first support layer are configured to be folded with respect to a rotary axis extending in the second direction, and the multi-bars guide a folding operation of the first support layer.

In an embodiment, under −20 degrees Celsius (° C.) conditions, the first resin layer has a modulus of about 300 (Kilopascal) kPa or less, and the second resin layers has a modulus of about 500 kPa or less.

In an embodiment, each of the first support layer and the second support layer include stainless steel.

In an embodiment, each of the hole groups include first holes, each of which extends in the second direction and which are spaced apart from each other in the second direction, and second holes which are spaced apart from the first holes in the first direction and spaced apart from each other in the second direction and each of which extends in the second direction. In an embodiment, the first holes and the second holes are arranged alternately with each other in the first direction, and the second holes are shifted from the first holes in the second direction.

In an embodiment, the third region is configured to be bent with respect to a virtual axis extending in the second direction, and the display device may further include a circuit board disposed in the third region.

In an embodiment of the inventive concept, a method of manufacturing a display device includes: forming a work substrate on which a display module including a folding region configured to be folded with respect to a rotary axis and a peripheral region adjacent to the folding region is disposed; applying a first adhesive material onto a rear surface of the display module, which overlaps the folding region, using an inkjet process; applying a second adhesive material having a higher modulus than the first adhesive material onto the rear surface, using an inkjet process; and curing at least one of the first adhesive material and the second adhesive material.

In an embodiment, the first adhesive material is applied onto the entirety of the rear surface overlapping the folding region in the applying of the first adhesive material, and the first adhesive material is cured to form a first resin layer after the applying of the first adhesive material. In an embodiment, the second adhesive material is applied onto the first resin layer at predetermined intervals in the applying of the second adhesive material, and the second adhesive material is cured to form second resin layers after the applying of the second adhesive material.

In an embodiment, in the applying of the first adhesive material and the applying of the second adhesive material, a first head is moved to apply the first adhesive material and then, a second head is moved to apply the second adhesive material, or the first head and the second head move together to apply the first and second adhesive materials at corresponding positions, respectively.

In an embodiment, the first adhesive material is applied onto the rear surface overlapping the folding region at predetermined intervals in the applying of the first adhesive material, and the first adhesive material is cured to form first resin layers after the applying of the first adhesive material. In an embodiment, the second adhesive material is applied between the first resin layers adjacent to each other in the applying of the second adhesive material, and the second adhesive material is cured to form second resin layers after the applying of the second adhesive material.

BRIEF DESCRIPTION OF THE FIGURES

The accompanying drawings are included to provide a further understanding of the inventive concept, and are incorporated in and constitute a part of this specification. The drawings illustrate embodiments of the inventive concept and, together with the description, serve to explain principles of the inventive concept. In the drawings:

Figure 1A:
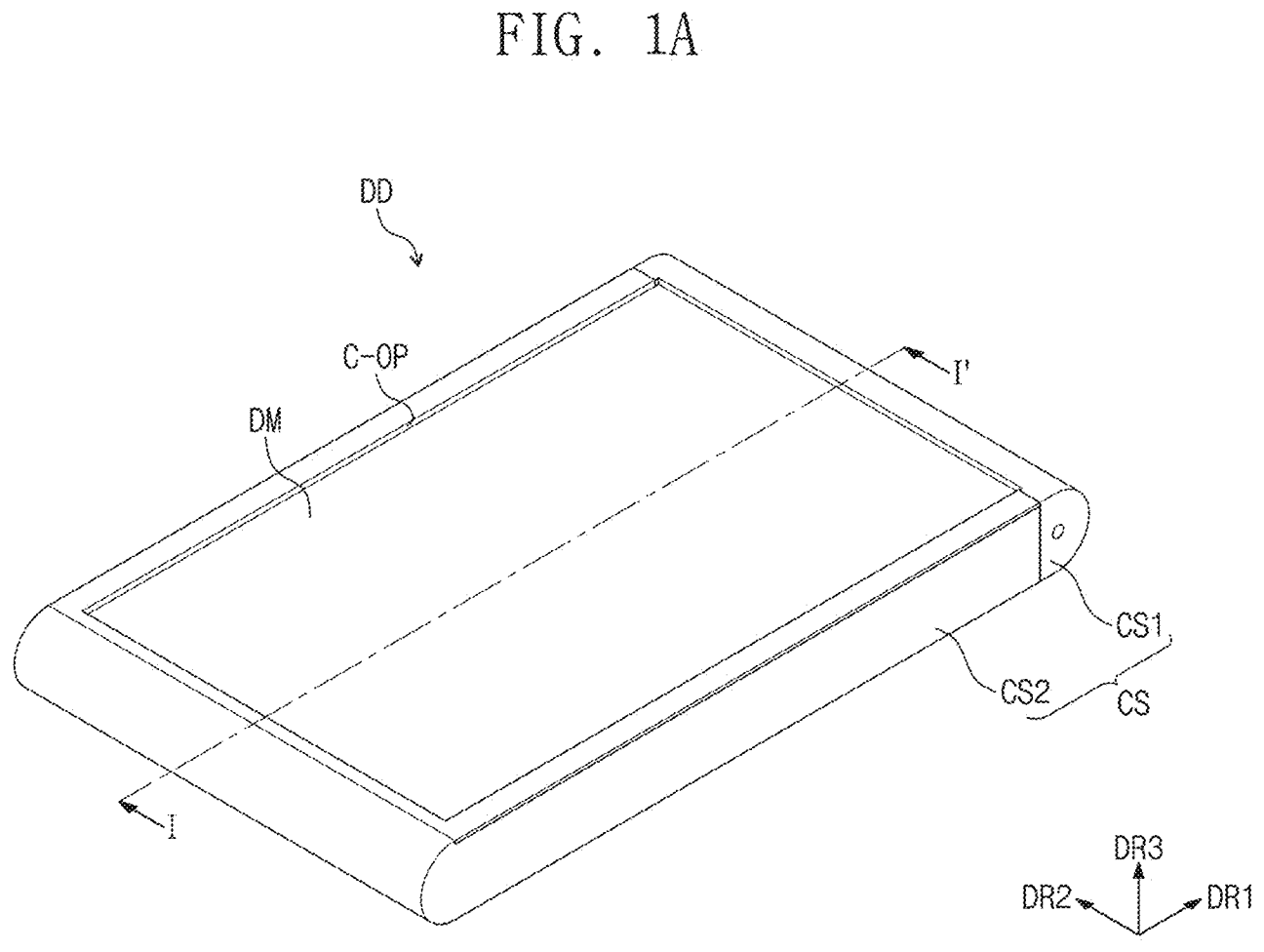

FIG. 1A is a perspective view of a display device according to an embodiment of the inventive concept;

FIG. 2A is a cross-sectional view of the display device taken along line I-I' in FIG. 1A;

FIG. 2C is a cross-sectional view of the display device taken along line I-I' in FIG. 1A;

DETAILED DESCRIPTION

Figure 1B:
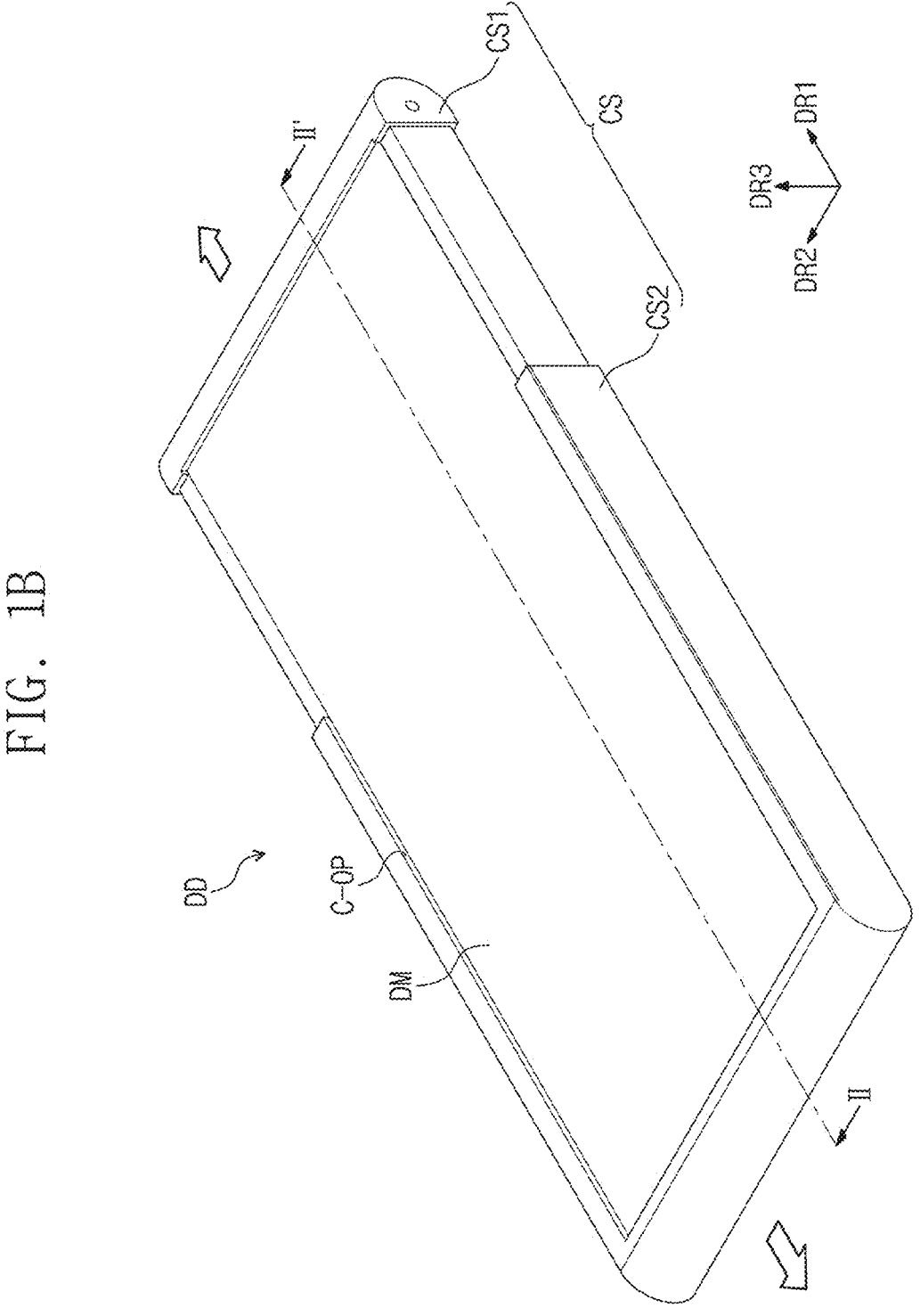
FIG. 1B is a perspective view of a display device according to an embodiment of the inventive concept.

It will be understood that when an element (or region, layer, section, etc.) is referred to as being "on", "connected to" or "coupled to" another element, it can be disposed directly on, connected or coupled to the other element or a third intervening element may be disposed between the elements.

Like reference numbers or symbols refer to like elements throughout. The term "and/or" includes any and all combinations of one or more of the associated listed items.

It will be understood that, although the terms first, second, etc. may be used herein to describe various elements, these elements are not limited by these terms. These terms are merely used to distinguish one element from another element. For example, a first element could be termed a second element without departing from the teachings of the present invention, and similarly, a second element could be termed a first element. As used herein, the singular forms are intended to include the plural forms as well, unless the context clearly indicates otherwise.

In addition, the terms, such as "below", "beneath", "on" and "above", are used for explaining the relation of elements shown in the drawings. The terms are relative concepts and are explained based on the direction shown in the drawing.

Hereinafter, embodiments of the inventive concept will be described with reference to the accompanying drawings.

FIG. 1A is a perspective view of a display device according to an embodiment of the inventive concept. FIG. 1B is a perspective view of a display device according to an embodiment of the inventive concept. FIG. 1A is a perspective view of a display device DD operating in a first mode, and FIG. 1B is a perspective view of the display device DD operating in a second mode different from the first mode.

The display device DD may be a device that is activated in response to an electrical signal and displays an image. The display device DD may include various embodiments. For example, the display device DD may be a large-sized device such as a television or an outdoor billboard, and may also be a small and medium-sized device such as a monitor, a smartphone, a tablet computer, a navigation device, or a game console. In this embodiment, a smartphone capable of performing a sliding operation is illustrated as an example of the display device DD. For example, a size of the display device DD may be expanded or contracted by sliding a portion of the display device DD.

Referring to FIGS. 1A and 1B, the display device DD may include a display module DM and a case CS in which the display module DM is accommodated. The display module DM may have at least a portion that is exposed to the outside through a display opening portion C-OP defined at an upper portion of the case CS. For example, the display opening portion C-OP may include an opening that exposes the portion of the display module DM.

The case CS may include a first case CS1 and a second case CS2. For example, the first case CS1 may be a first part of the case CS and the second case CS2 may be a second part of the case CS. The first case CS1 and the second case CS2 may be coupled to each other to accommodate the display module DM. The first case CS1 may be coupled to the second case CS2 so as to be movable in a direction parallel to a first direction DR1. The first case CS1 may be coupled to the second case CS2 and move so as to be close to or away from the second case CS2 according to a user's use state. For example, a size of the display device DD may be contracted by moving the first case CS1 towards the second case CS2 or expanded by moving the first case CS1 away from the second case CS2.

A display surface of the display module DM, which is exposed by the display opening portion C-OP, may be parallel to each of the first direction DR1 and a second direction DR2 crossing the first direction DR1. The display module DM may display an image on the display surface, which is parallel to the first direction DR1 and the second direction DR2, in a third direction DR3.

The third direction DR3 used herein may be defined as a direction substantially perpendicularly crossing a plane defined by the first direction DR1 and the second direction DR2. A front surface (or top surface) and a rear surface (or bottom surface) of each of members, which constitute the display device DD, may oppose each other in the third direction DR3, and a normal direction to each of the front surface and the rear surface may be substantially parallel to the third direction DR3. A spaced distance between the front surface and the rear surface, which is defined in the third direction DR3, may correspond to a thickness of a member (or unit).

The term "in a plane" or "on a plane" used herein may be defined as a state as viewed in the third direction DR3. The term "in a cross-sectional view" or "on a cross-sectional view" used herein may be defined as a state as viewed in the first direction DR1 or the second direction DR2. Meanwhile, directions indicated by the first to third directions DR1, DR2 and DR3 are relative concepts and may be changed to other directions.

Referring to FIGS. 1A and 1B, the display surface of the display module DM, which is exposed by the display opening portion C-OP of the case CS, may have an area that varies with movement of the first case CS1. As the first case CS1 is moved away from the second case CS2, an opening area of the display opening portion C-OP may increase in the first direction DR1. As the first case is moved towards the second case CS2, the opening area of the display opening portion C-OP may decrease in the first direction DR1.

The display module DM may be a flexible display module, and may be supported by a support layer disposed below the display module DM. When the first case CS1 moves in the first direction DR1, the support layer connected to the first case CS1 may also move together with the first case CS1 in the first direction DR1. Accordingly, the display module DM disposed on the support layer may also move according to the movement of the first case CS1 in the first direction DR1. Since an end of the display module DM moves together with the first case CS1 in the first direction DR1, a portion of the display module DM, which is accommodated in the second case CS2 in the first mode, may be exposed to the outside, and the display surface of the display module DM, which is exposed by the display opening portion C-OP, may be expanded.

FIG. 1A illustrates the display device DD in the first mode, in which the first case CS1 is disposed to be closest to the second case CS2 in the first direction DR1, among operation states of the display device DD. In the first mode, a portion extending from one region of the display module DM, which is exposed by the display opening portion C-OP, may be folded with a predetermined curvature and accommodated in the second case CS2. The first mode in which the display surface of the display module DM is set to a basic size may be defined as a basic mode.

FIG. 1B illustrates the display device DD in the second mode, in which the first case CS1 is disposed to be farthest away from the second case CS2 in the first direction DR1, among the operation states of the display device DD. In the display device DD in the second mode, the area of the display surface of the display module DM, which is exposed by the display opening portion C-OP, may increase compared to the first mode. That is, the second mode in which the display surface in the basic mode is expanded may be defined as an expansion mode.

The first mode and the second mode of the display device DD may be determined according to the sliding operation of the case CS and the display module DM. A user may expand the display surface of the display device DD to generate an expanded display surface by changing an operation mode of the display device DD from the first mode to the second mode, and may view an image through the expanded display surface. In addition, the user may reduce the display surface of the display device DD to generate a reduced display surface by changing the operation mode of the display device DD from the second mode to the first mode, and may view an image through the reduced display surface. That is, the user may select any one of the first mode and the second mode of the display device DD, thereby variously adjusting the area of the display surface of the display device DD, which is exposed from the case CS. For example, the user may pull the first case CS1 outward to enter the second mode and push the first case CS1 inward to enter the first mode.

Figure 2A:
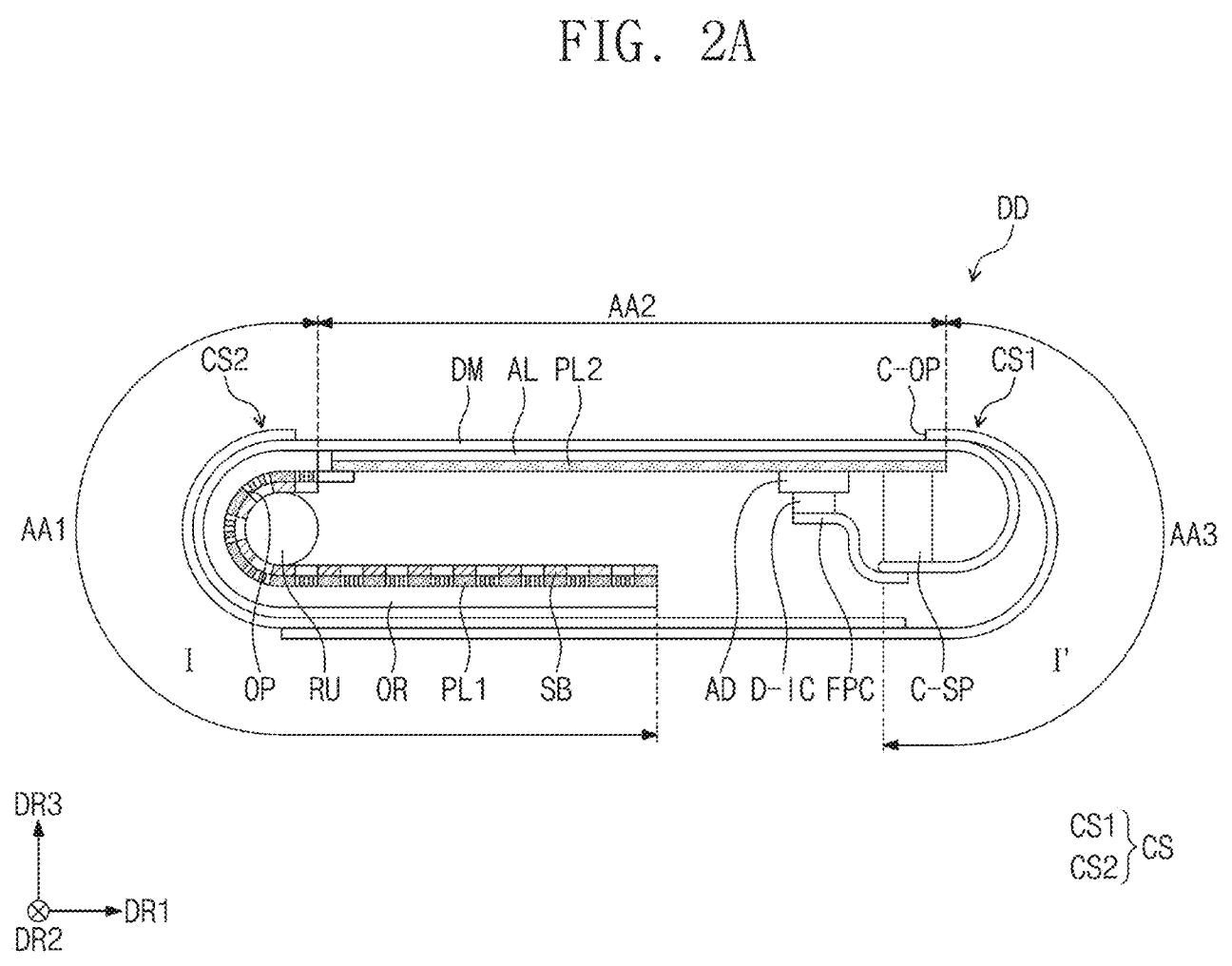
Figure 2B:
FIG. 2B is a cross-sectional view of the display device taken along line II-II' in FIG. 1B.
Figure 2C:
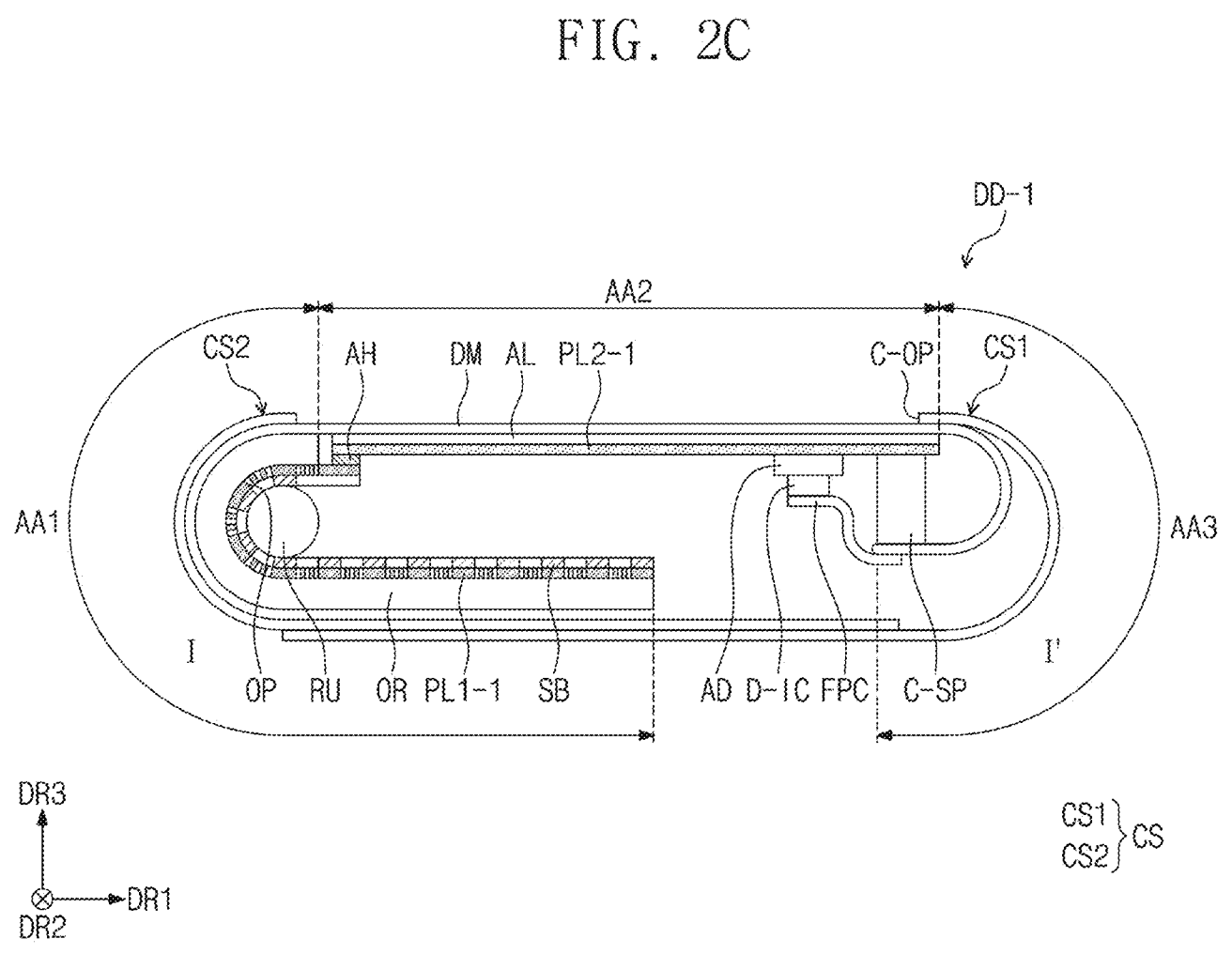
Figure 2D:
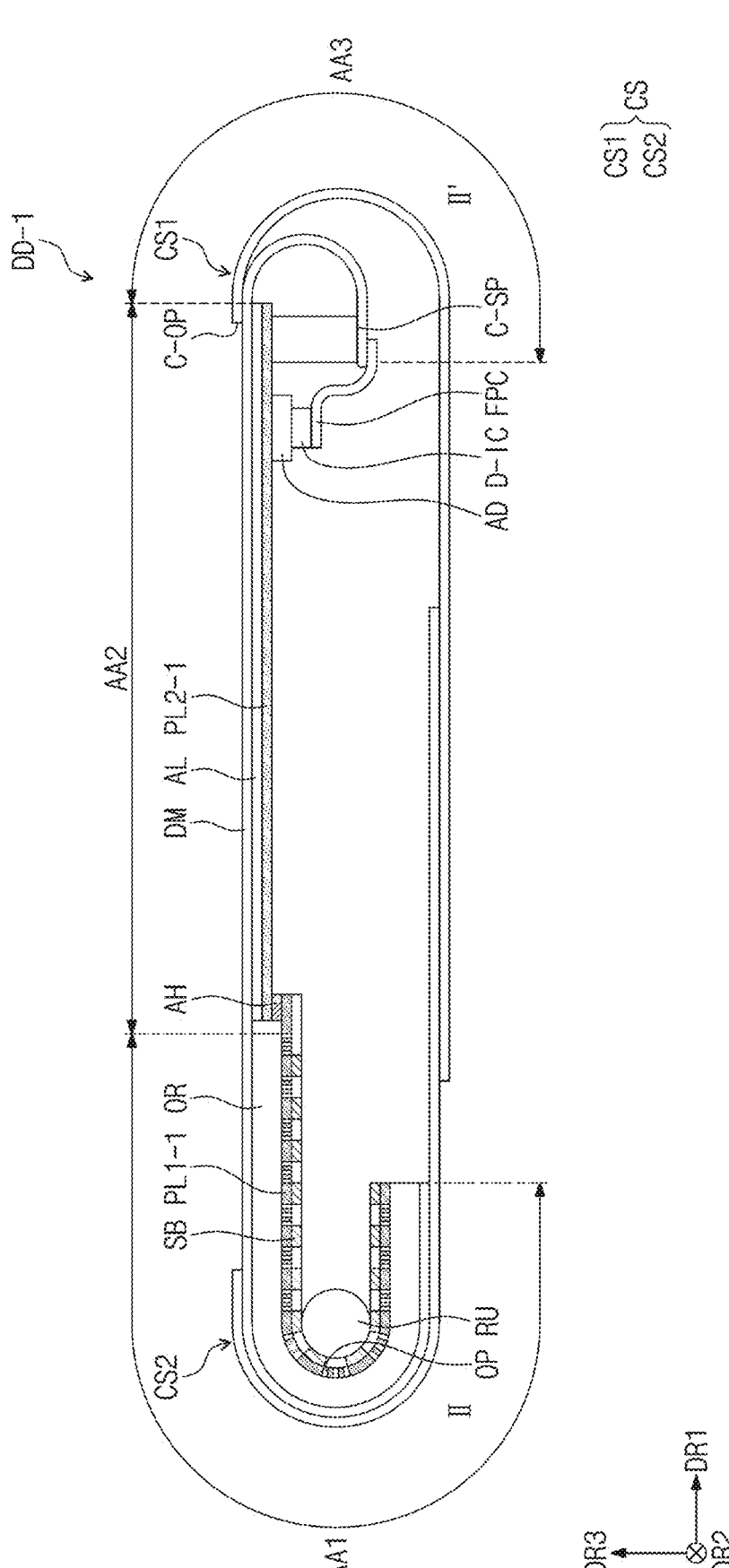
FIG. 2D is a cross-sectional view of the display device taken along line II-II' in FIG. 1B.
Figure 3:
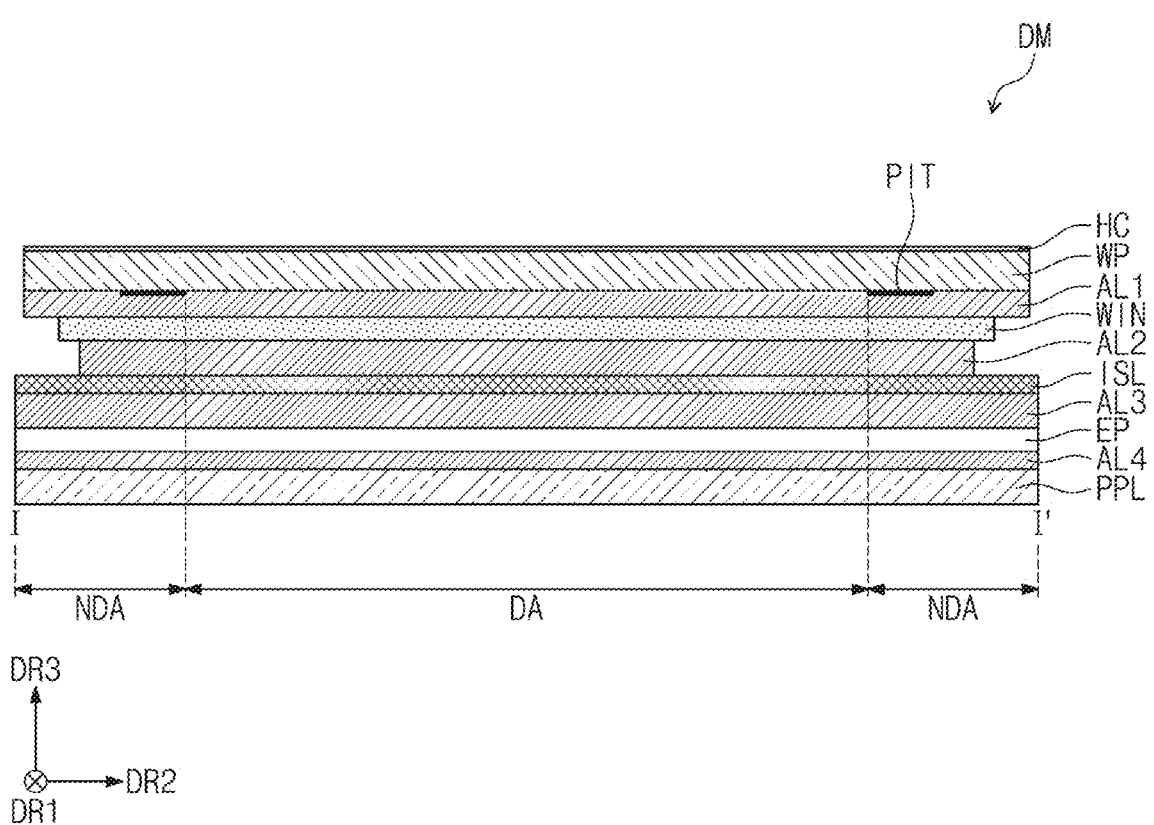
FIG. 3 is a cross-sectional view of a display module according to an embodiment of the inventive concept.
Figure 4:
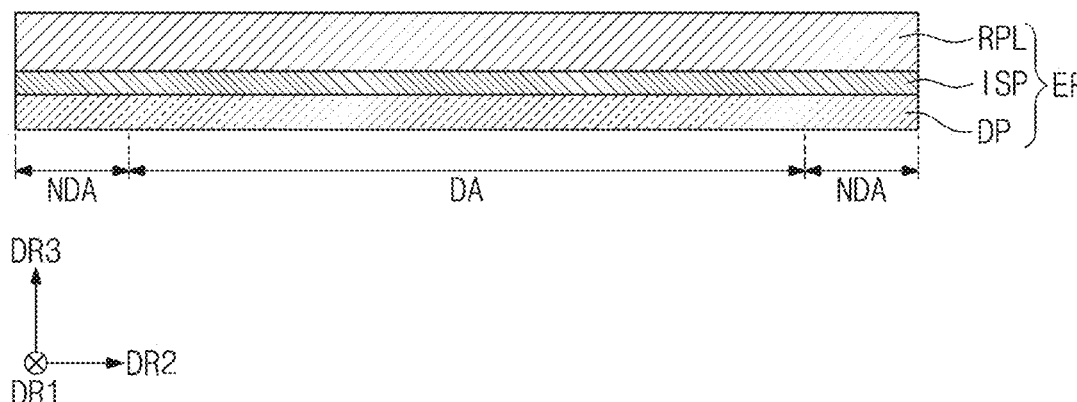
FIG. 4 is a cross-sectional view of an electronic panel according to an embodiment of the inventive concept.
Figure 5:
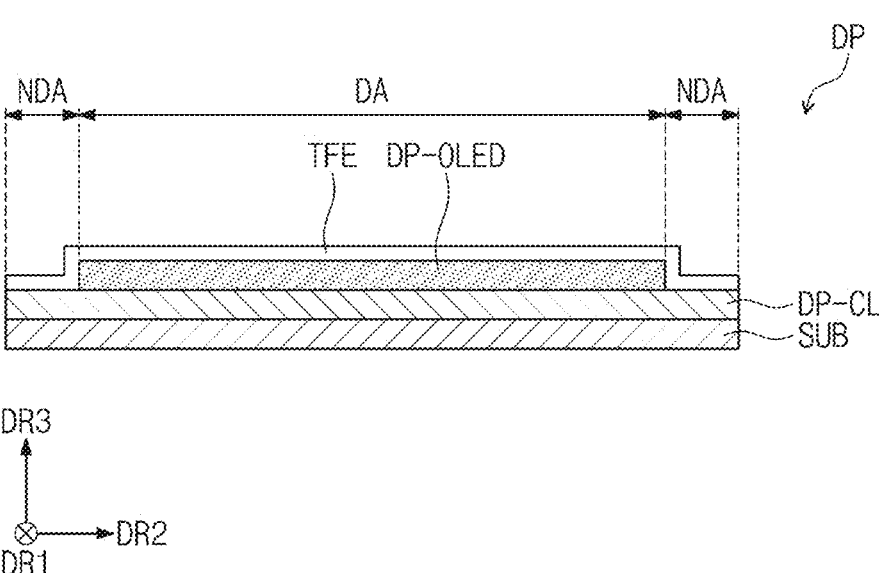
FIG. 5 is a cross-sectional view of a display panel according to an embodiment of the inventive concept.
Figure 6:
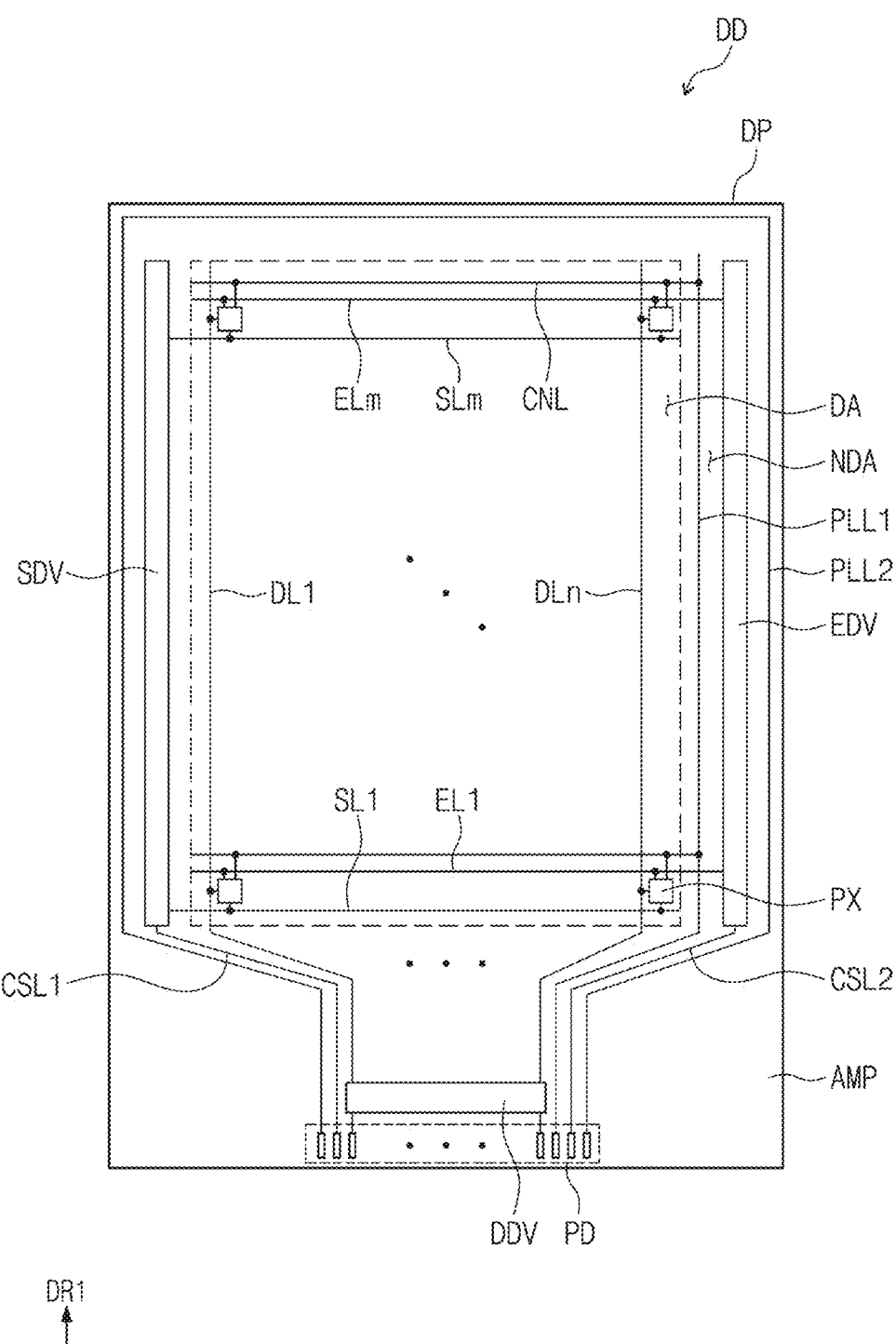
FIG. 6 is a plan view of a display panel according to an embodiment of the inventive concept.

FIG. 2A is a cross-sectional view of the display device taken along line I-I' in FIG. 1A. FIG. 2B is a cross-sectional view of the display device taken along line II-II' in FIG. 1B. FIG. 2C is a cross-sectional view of the display device taken along line I-I' in FIG. 1A. FIG. 2D is a cross-sectional view of the display device taken along line II-II' in FIG. 1B. FIG. 3 is a cross-sectional view of a display module according to an embodiment of the inventive concept. FIG. 4 is a cross-sectional view of an electronic panel according to an embodiment of the inventive concept. FIG. 5 is a cross-sectional view of a display panel according to an embodiment of the inventive concept. FIG. 6 is a plan view of a display panel according to an embodiment of the inventive concept.

Referring to FIGS. 2A and 2B, a display device DD may include a case CS, a display module DM accommodated in the case CS, a rotary unit RU, and a support module that is disposed below the display module DM and supports the display module DM. The support module may guide the display module DM such that the display module DM is changed in shape while a sliding operation is repeated.

The display device DD according to an embodiment may include the display module DM, first and second cases CS1 and CS2, the rotary unit RU, a first support layer PL1, a second support layer PL2, a first adhesive layer OR, a second adhesive layer AL, multi-bars SB, a flexible circuit board FPC, a driving chip D-IC, and a spacer C-SP.

The display module DM may be a flexible display module. The display module DM may include a first region AA1, a second region AA2, and a third region AA3. The first region AA1 and the third region AA3 of the display module DM may be accommodated in the case CS (see FIG. 1A) in a folded state. The first region AA1, a second region AA2, and a third region AA3 may be arranged sequentially in the first direction DR1.

According to an embodiment of the inventive concept, a support module (e.g., a support layer), which supports the first region AA1 that is changed in shape along a curved surface of the rotary unit RU between a first mode and a second mode, and a support module, which supports the second region AA2 maintained to be in a flat state in the first mode and the second mode, have different mechanical properties and thus, may include different components. Accordingly, in an embodiment, the first adhesive layer OR for coupling the first region AA1 of the display module DM and the first support layer PL1 to each other and the second adhesive layer AL for coupling the second region AA2 of the display module DM and the second support layer PL2 to each other include different materials.

The first support layer PL1 may be disposed at a lower portion of the display module DM, which overlaps the first region AA1, and the first adhesive layer OR may be disposed between the first region AA1 and the first support layer PL1. The first region AA1 of the display module DM may be a region that changes in shape during the sliding operation of the display device DD. Hole groups OP may be present in the first support layer PL1. The hole groups OP may pass through the first support layer PL1 from a front surface to a rear surface. The first support layer PL1 may reduce stress applied to the first support layer PL1 through the hole groups OP. The shape of the first support layer PL1 may be changed. The hole groups OP will be described later.

The second support layer PL2 may be disposed at a lower portion of the display module DM, which overlaps the second region AA2. The second adhesive layer AL may be disposed between the second region AA2 and the second support layer PL2. The second region AA2 of the display module DM may correspond to a display surface exposed by a display opening portion C-OP in the first mode.

The third region AA3 may be a region configured to be bent with respect to a virtual axis extending in the second direction DR2. The flexible circuit board FCP may be connected to the third region AA3 of the display module DM. Pads included in the flexible circuit board FCP may be connected to pads PD (see FIG. 6), which are included in a display panel DP (see FIG. 6), through an anisotropic conductive film (ACF). The flexible circuit board FCP may be connected to the driving chip D-IC. The driving chip D-IC may include elements for driving the display panel DP (see FIG. 6). The driving chip D-IC may be coupled to the display module DM through an adhesive layer AD. However, embodiments of the inventive concept are not limited thereto. For example, the driving chip D-IC may be mounted in the third region AA3 of the display module DM. In an embodiment, the flexible circuit board FCP is omitted.

The display device DD according to an embodiment further includes the spacer C-SP for maintaining a shape in a bent state of the third region AA3. The spacer C-SP may be disposed between an end of the third region AA3 and the second support layer PL2 and support the display module DM so that the third region AA3 of the display module DM is maintained to be in the bent state.

Referring to FIG. 2A, the display surface of the display module DM, which corresponds to the second region AA2 in the first mode, may be exposed to the outside. In the first mode, the second region AA2 may be provided to be parallel to the first direction DR1 and the second direction DR2, and the second region AA2 may be provided as a plane. The first region AA1 may have an end that overlaps the second region AA2 in the third direction DR3 in the folded state. In the present disclosure, the first region AA1 may be defined as a "folding region", and each of the second region AA2 and the third region AA3 may be defined as a "peripheral region".

The rotary unit RU may be accommodated in the second case CS2. The rotary unit RU may rotate around a virtual rotary axis extending in the second direction DR2. FIGS. 2A and 2B illustrate the rotary unit RU rotatable around the rotary axis. The rotary unit RU may be coupled to at least one of the first case CS1 or the second case CS2 and rotate around the rotary axis according to the sliding operation in which the first case CS1 is moved away from or close to the second case CS2.

The first case CS1 may be in a second mode state illustrated in FIG. 2B by moving it to be away from the second case CS2 in the first direction DR1 in the first mode as in FIG. 2A. When an operation mode of the display device DD is changed from the first mode to the second mode, an end of the second region AA2, which is spaced apart from the first region AA1, may be coupled so as to be fixed to the first case CS1 and move together with the first case CS1. Here, an end of the first region AA1 of the display module DM, which is spaced apart from the second region AA2, may move in a direction opposite to the end of the second region AA2, which is coupled to the first case CS1.

According to an embodiment, the first support layer PL1 and the second support layer PL2 may be spaced apart from each other in the first direction DR1 to have a predetermined space therebetween. In an embodiment, a thickness of the first adhesive layer OR is greater than or equal to the sum of a thickness of the second support layer PL2 and a thickness of the second adhesive layer AL in a cross-sectional view.

When the operation mode of the display device DD is changed from the first mode to the second mode, the first support layer PL1, the first adhesive layer OR, and the multi-bars SB that support the first region AA1 of the display module DM may be disposed on the curved surface of the rotary unit RU and be folded to have a predetermined curvature. When the operation mode is changed from the first mode to the second mode, the first region AA1 of the display module DM, the first support layer PL1, the first adhesive layer OR, and the multi-bars SB may move along the curved surface of the rotary unit RU. Each of the multi-bars SB may further include joint portions disposed between adjacent multi-bars SB. The joint portions may guide the multi-bars SB such that the shape of the multi-bars SB is changed during the sliding operation of the display device DD.

According to an embodiment, a portion of the display surface, which corresponds to the first region AA1, may be exposed to the outside in the first mode, and when the operation mode is changed from the first mode to the second mode, an area in which the first region AA1 is exposed to the outside by the display opening portion C-OP may increase. However, embodiments of the inventive concept are not limited thereto. For example, in an embodiment, the display surface corresponding to the first region AA1 is not exposed to the outside in the first mode.

Referring to FIGS. 2C and 2D, a display device DD-1 according to an embodiment may include a display module DM, first and second cases CS1 and CS2, a rotary unit RU, a first support layer PL1-1, a second support layer PL2-1, a first adhesive layer OR, a second adhesive layer AL, multi-bars SB, a flexible circuit board FPC, a driving chip D-IC, and a spacer C-SP. In addition, the display device DD-1 may further include an intervening adhesive layer AH. The description will be focused on differences from the configuration of the display device DD described with reference to FIGS. 2A and 2B.

According to an embodiment, the first support layer PL1-1 and the second support layer PL2-1 are coupled to each other through the intervening adhesive layer AH. An end of the first support layer PL1-1, which is adjacent to the second support layer PL2-1, may extend to a second region AA2 to overlap the second region AA2.

The intervening adhesive layer AH may be disposed on the end of the first support layer PL1-1, which overlaps the second region AA2. The intervening adhesive layer AH may be disposed between the first support layer PL1-1 and the second support layer PL2-1 to couple the first support layer PL1-1 and the second support layer PL2-1 to each other. The intervening adhesive layer AH is not limited to any one material as long as the material has two opposite surfaces having adhesion (e.g., the ability to adhere to another layer).

According to an embodiment, the first adhesive layer OR has a thickness that is greater than the sum of a thickness of the second support layer PL2-1 and a thickness of the second adhesive layer AL in a cross-sectional view.

Since the display device DD-1 according to this embodiment further includes the intervening adhesive layer AH that couples the first support layer PL1-1 and the second support layer PL2-1 to each other, the first support layer PL1-1 and the second support layer PL2-1 may be stably coupled to each other when a state is changed from a first mode to a second mode. Accordingly, the display device DD-1 with increased durability may be provided.

FIG. 3 is a cross-sectional view of a display module according to an embodiment of the inventive concept. FIG. 4 is a cross-sectional view of an electronic panel according to an embodiment of the inventive concept. FIG. 5 is a cross-sectional view of a display panel according to an embodiment of the inventive concept. FIG. 6 is a plan view of a display panel according to an embodiment of the inventive concept.

Referring to FIG. 3, a display module DM may include an electronic panel EP, an impact absorption layer ISL, a panel protective layer PPL, a window WIN, a window protective layer WP, a hard coating layer HC, and first to fourth adhesive layers AL1 to AL4. For example, a fourth adhesive layer AL4 may be formed on the panel protective layer PPL, an electronic panel EP may be formed on the fourth adhesive layer AL4, a third adhesive layer AL3 may be formed on the electronic panel EP, an impact absorption layer ISL may be formed on the third adhesive layer AL3, a second adhesive layer AL2 may be formed on the impact absorption layer ISL, the window WIN may be formed on the second adhesive layer AL2, the first adhesive layer AL1 may be formed on the window WIN, the window protective layer WP may be formed on the first adhesive layer AL1, and the hard coating layer HC may be formed on the window protective layer WP.

The electronic panel EP may display an image. The electronic panel EP may include a display panel, an input sensing part, and an anti-reflective layer, and the configuration of such an electronic panel EP will be described later with reference to FIG. 4.

The impact absorption layer ISL may be disposed on the electronic panel EP. The impact absorption layer ISL may absorb an external impact applied toward the electronic panel EP from above the display device DD, and protect the electronic panel EP. The impact absorption layer ISL may be manufactured in the form of an oriented film.

The impact absorption layer ISL may include a flexible plastic material. The flexible plastic material may be a synthetic resin film. For example, the impact absorption layer ISL may include a flexible plastic material such as polyimide or polyethylene terephthalate.

The window WIN may be disposed on the impact absorption layer ISL. The window WIN may protect the electronic panel EP from external scratches. For example, the window WIN may prevent the electronic panel EP from being scratched. The window WIN may have an optically transparent property. The window WIN may include glass. However, embodiments of the inventive concept are not limited thereto. For example, the window WIN may include a synthetic resin film.

The window WIN may have a multilayer structure or a single-layer structure. For example, the window WIN may include a plurality of synthetic resin films coupled to each other through an adhesive, or include a glass substrate and a synthetic resin film that are coupled to each other through an adhesive.

The window protective layer WP may be disposed on the window WIN. The window protective layer WP may include a flexible plastic material such as polyimide or polyethylene terephthalate. The hard coating layer HC may be disposed on a top surface of the window protective layer WP. The hard coating layer HC may include any one of an organic compound, an inorganic compound, and an organic/inorganic composite compound. For example, the hard coating layer HC may include an acrylic compound, an epoxy-based compound, or a combination thereof. Alternatively, the hard coating layer HC may include any one inorganic compound of silicon nitride, silicon oxynitride, silicon oxide, zirconium oxide, aluminum oxide, tantalum oxide, niobium oxide, and glass bead.

In an embodiment, a print layer PIT is disposed on a bottom surface of the window protective layer WP. The print layer PIT may have a black color, but the color of the print layer PIT is not limited thereto. The print layer PIT may be adjacent to an edge of the window protective layer WP. The print layer PIT may overlap a non-display region NDA. There may be a plurality of the print layer PIT in different parts of the non-display region NDA. The print layer PIT may be adjacent to an outer edge of the display region DA.

The panel protective layer PPL may be disposed below the electronic panel EP. The panel protective layer PPL may protect a lower portion of the electronic panel EP. The panel protective layer PPL may include a flexible plastic material. For example, the panel protective layer PPL may include polyimide or polyethylene terephthalate.

The first adhesive layer AL1 may be disposed between the window protective layer WP and the window WIN. The window protective layer WP and the window WIN may be bonded to each other through the first adhesive layer AL1. The first adhesive layer AL1 may cover the print layer PIT.

The second adhesive layer AL2 may be disposed between the window WIN and the impact absorption layer ISL. The window WIN and the impact absorption layer ISL may be bonded to each other through the second adhesive layer AL2.

The third adhesive layer AL3 may be disposed between the impact absorption layer ISL and the electronic panel EP. The impact absorption layer EP and the electronic panel EP may be bonded to each other through the third adhesive layer AL3.

The fourth adhesive layer AL4 may be disposed between the electronic panel EP and the panel protective layer PPL. The electronic panel EP and the panel protective layer PPL may be bonded to each other through the fourth adhesive layer AL4.

The first to fourth adhesive layers AL1 to AL4 may include a pressure sensitive adhesive (PSA) or an optically clear adhesive (OCA), but the type of the adhesive is not limited thereto.

Referring to FIG. 4, in an embodiment, the electronic panel EP includes a display panel DP, an input sensing part ISP (e.g., an input sensing layer) disposed on the display panel DP, and an anti-reflection layer RPL disposed on the input sensing part ISP. As an example, FIG. 4 illustrates a cross section of the electronic panel EP when viewed in the first direction DR1.

The display panel DP may be a flexible display panel. For example, the display panel DP may include a flexible substrate and a plurality of elements disposed on the flexible substrate.

The display panel DP according to an embodiment of the inventive concept may be a light emitting display panel, but is not limited thereto. For example, the display panel DP may be an organic light emitting display panel or an inorganic light emitting display panel. An emission layer of the organic light emitting display panel may include an organic luminescent material. An emission layer of the inorganic light emitting display panel may include a quantum dot, a quantum rod, and so on. Hereinafter, the display panel DP is described as the organic light emitting display panel.

The input sensing part ISP may include a plurality of sensors (not illustrated) for detecting an external input. For example, the input sensing part ISP may detect the external input by using a capacitance method, but the sensing method of the input sensing part ISP is not limited thereto. The input sensing part ISP may be formed directly on the display panel DP during manufacture of the electronic panel EP.

The anti-reflective layer RPL may be disposed on the input sensing part ISP. The anti-reflective layer RPL may be formed directly on the input sensing part ISP during the manufacture of the electronic panel EP. The anti-reflective layer RPL may be defined as a film that prevents the reflection of external light. The anti-reflective layer RPL may reduce the reflectance of external light incident toward the display panel DP from above the display device DD.

When the external light traveling toward the display panel DP is reflected by the display panel DP and provided for an external user again, the external light may be visible to the user like a mirror. To prevent the external light from being visible, the anti-reflection layer RPL may include, for example, a plurality of color filters that display the same colors as pixels of the display panel DP.

The color filters may filter the external light to have the same colors as the pixels. In this case, the external light may not be visible to the user. However, embodiments of the inventive concept are not limited thereto. For example, the anti-reflective layer RPL may include a retarder and/or a polarizer to reduce the reflectance of the external light.

As an example, the input sensing part ISP may be formed directly on the display panel DP, and the anti-reflective layer RPL may be formed directly on the input sensing part ISP. However, embodiments of the inventive concept are not limited thereto. For example, the input sensing part ISP may be separately manufactured and attached to the display panel DP through an adhesive layer, and the anti-reflective layer RPL may be separately manufactured and attached to the input sensing part ISP through an adhesive layer.

FIG. 5 is a cross-sectional view of a display panel, which illustrates a configuration of the display panel illustrated in FIG. 4.

As an example, FIG. 5 illustrates a cross section of the display panel DP when viewed in the first direction DR1.

Referring to FIG. 5, in an embodiment, the display panel DP includes a substrate SUB, a circuit element layer DP-CL disposed on the substrate SUB, a display element layer DP-OLED disposed on the circuit element layer DP-CL, and a thin film encapsulation layer TFE disposed on the display element layer DP-OLED.

The substrate SUB may include a display region DA and a non-display region NDA around the display region DA. For example, the substrate SUB may extend into the non-display region NDA from the display region DA. The substrate SUB may include a flexible plastic material such as polyimide. The display element layer DP-OLED may be disposed on the display region DA.

The display panel DP may include a plurality of insulation layers, a semiconductor pattern, a conductive pattern, a signal line, and so on. The insulation layers, the semiconductor layer, and the conductive layer may be formed by using a method such as coating or deposition. Thereafter, the insulation layers, the semiconductor layer, and the conductive layer may be selectively patterned through a photolithography process and an etching process. The semiconductor pattern, the conductive pattern, the signal line, and so on, which are included in the circuit element layer DP-CL and the display element layer DP-OLED, are formed through such a manner.

In an embodiment, the circuit element layer DP-CL includes at least one insulation layer and a circuit element. The insulation layer may include at least one inorganic layer and at least one organic layer. The circuit element may include signal lines, a driving circuit of a pixel, and so on.

In an embodiment, the display element layer DP-OLED includes a conductive barrier rib and a light emitting element. The light emitting element may include an anode, an emission pattern, and a cathode, and the emission pattern may include at least an emission layer.

The encapsulation layer TFE includes a plurality of thin films. In an embodiment, some thin films of the encapsulation layer TFE are disposed to increase optical efficiency, and some of the other thin films of the encapsulation layer TFE are disposed to protect organic light emitting diodes.

A plurality of pixels may be disposed in the display region DA. Each of the pixels may include the light emitting element connected to a transistor, which is disposed in the circuit element layer DP-CL, and disposed in the display element layer DP-OLED.

The thin film encapsulation layer TFE may be disposed on the circuit element layer DP-CL so as to cover the display element layer DP-OLED. The thin film encapsulation layer TFE may include inorganic layers and an organic layer between the inorganic layers. The inorganic layers may protect the pixels from moisture/oxygen. The organic layer may protect the pixels from foreign matter such as dust particles.

FIG. 6 is a plan view of the display panel illustrated in FIG. 5.

Referring to FIG. 6, in an embodiment, the display device DD includes the display panel DP, a scan driver SDV (e.g., a scan driver circuit), a data driver DDV (e.g., a data driver circuit), an emission driver EDV (e.g., an emission driver circuit), and a plurality of pads PD.

The display panel DP may have a rectangular shape with long sides extending in the first direction DR1 and short sides extending in the second direction DR2, but the shape of the display panel DP is not limited thereto. The display panel DP may include a display region DA and a non-display region NDA surrounding the display region DA.

The display panel DP may include a plurality of pixels PX, a plurality of scan lines SL1 to SLm, a plurality of data lines DL1 to DLn, a plurality of emission lines EL1 to ELm, first and second control lines CSL1 and CSL2, first and second power lines PLL1 and PLL2, and connection lines CNL. Here, m and n are natural numbers.

The pixels PX may be disposed in the display region DA. The scan driver SDV and the emission driver EDV may be disposed in the non-display region NDA adjacent to each of the long sides of the display panel DP. The data driver DDV may be disposed in the non-display region NDA adjacent to any one of the short sides of the display panel DP. The data driver DDV may be adjacent to a lower end of the display panel DP when viewed on a plan view.

In FIG. 6, an accommodation part AMP may be defined as the non-display region NDA adjacent to the lower end of the display panel DP. The data driver DDV may be disposed in the accommodation part AMP.

The scan lines SL1 to SLm may extend in the second direction DR2 to be connected to the pixels PX and the scan driver SDV. The data lines DL1 to DLn may extend in the first direction DR1 to be connected to the pixels PX and the data driver DDV. The emission lines EL1 to ELm may extend in the second direction DR2 to be connected to the pixels PX and the emission driver EDV.

The first power line PLL1 may extend in the first direction DR1 to be disposed in the non-display region NDA. The first power line PLL1 may be disposed between the display region DA and the emission driver EDV.

The connection lines CNL may extend in the second direction DR2 and be arranged in the first direction DR1 to be connected to the first power line PLL1 and the pixels. A first voltage may be applied to the pixels PX through the first power line PLL1 and the connection lines CNL, which are connected to each other.

The second power line PLL2 may be disposed in the non-display region NDA, and extend along the long sides of the display panel DP and the other short side of the display panel DP, at which the data driver DDV is not disposed. The second power line PLL2 may be disposed outward from the scan driver SDV and the emission driver EDV.

The second power line PLL2 may extend toward the display region DA to be connected to the pixels PX. A second voltage having a lower level than the first voltage may be applied to the pixels PX through the second power line PLL2.

The first control line CSL1 may be connected to the scan driver SDV and extend toward the lower end of the display panel DP. The second control line CSL2 may be connected to the emission driver EDV and extend toward the lower end of the display panel DP. The data driver DDV may be disposed between the first control line CSL1 and the second control line CSL2.

The pads PD may be disposed in the non-display region NDA adjacent to the lower end of the display panel DP, and may be more adjacent to the lower end of the display panel DP than the data driver DDV is. The data driver DDV, the first power line PLL1, the second power line PLL2, the first control line CSL1, and the second control line CSL2 may be connected to the pads PD. The data lines DL1 to DLn may be connected to the data driver DDV, and the data driver DDV may be connected to the pads PD corresponding to the data lines DL1 to DLn.

The display device DD may further include a timing controller (e.g., a controller circuit) for controlling an operation of each of the scan driver SDV, the data driver DDV, and the emission driver EDV, and a voltage generator for generating the first and second voltages. The timing controller and the voltage generator may be connected to the pads PD through the flexible circuit board FPC (see FIG. 2A).

The scan driver SDV may generate a plurality of scan signals, and the scan signals may be applied to the pixels PX through the scan lines SL1 to SLm. The data driver DDV may generate a plurality of data voltages, and the data voltages may be applied to the pixels PX through the data lines DL1 to DLn. The emission driver EDV may generate a plurality of emission signals, and the emission signals may be applied to the pixels PX through the emission lines EL1 to ELm.

The pixels PX may receive the data voltages in response to the scan signals. The pixels PX may display an image by emitting light with brightness corresponding to the data voltages in response to the emission signals.

Figure 7:
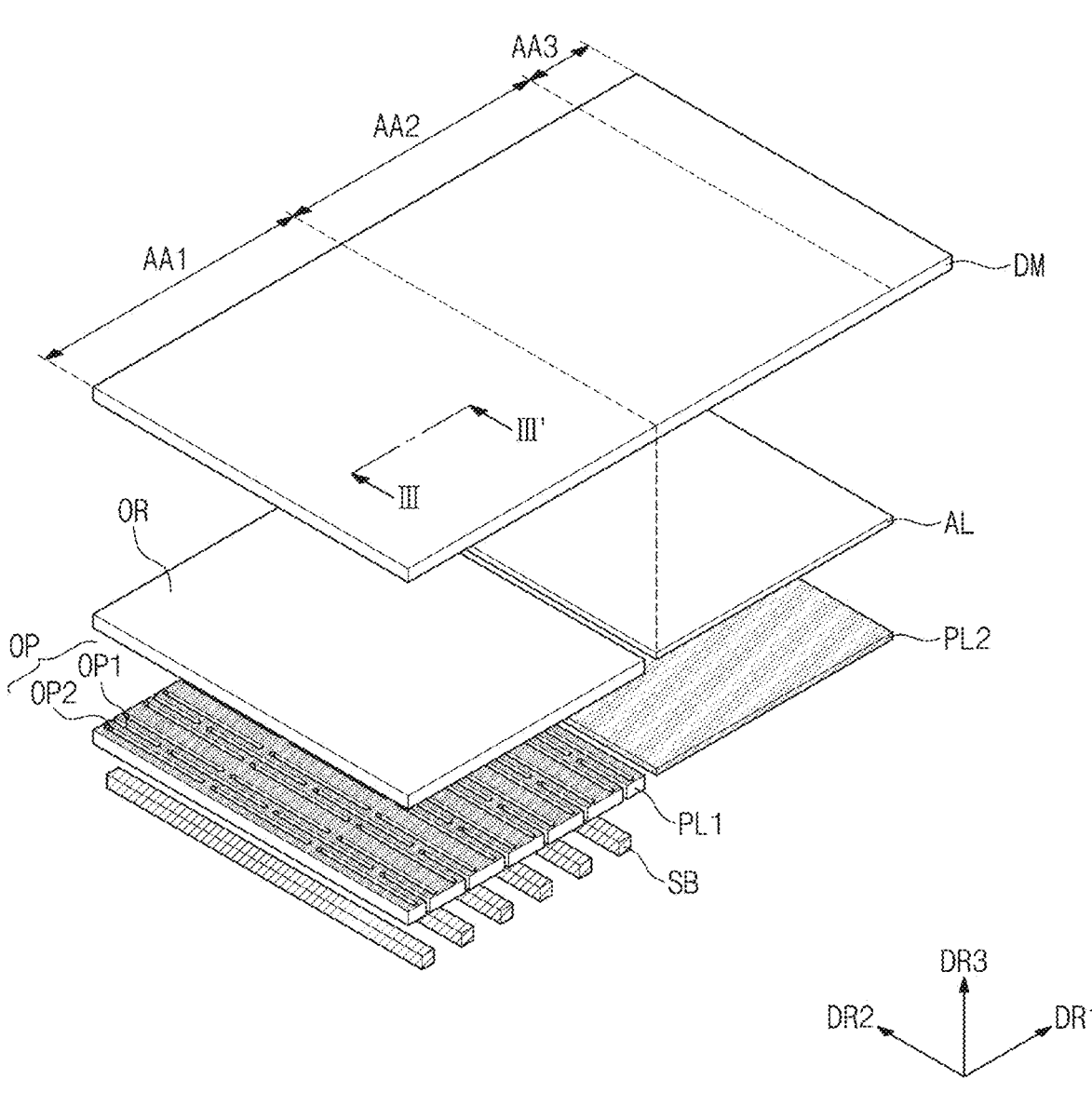
FIG. 7 is an exploded perspective view of some components included in a display device according to an embodiment of the inventive concept.

FIG. 7 is an exploded perspective view of some components included in a display device according to an embodiment of the inventive concept. FIGS. 8 to 12 are cross-sectional views of the display device taken along line III-III' in FIG. 7.

FIG. 7 illustrates an arrangement relationship of a display module DM in an unfolded state, a first adhesive layer OR, a second adhesive layer AL, a first support layer PL1, a second support layer PL2, and multi-bars SB among components of a display device DD.

The display module DM may include a first region AA1, a second region AA2, and a third region AA3. The first region AA1 of the display module DM may be defined as a region that is changed in shape during a sliding operation of the display device DD. The second region AA2 of the display module DM may correspond to a display surface exposed by a display opening portion C-OP in a first mode. The third region AA3 of the display module DM may be a region that is bent or bendable with respect to a virtual axis extending in the second direction DR2. In an embodiment, the first region AA1 and the third region AA3 are accommodated or located in the case CS (see FIG. 1A) in a folded state.

The first support layer PL1 may be disposed at a lower portion of the display module DM, which overlaps the first region AA1. The first adhesive layer OR may be disposed between the first region AA1 and the first support layer PL1. The first adhesive layer OR may couple the display module DM and the first support layer PL1 to each other.

The second support layer PL2 may be disposed at a lower portion of the display module DM, which overlaps the second region AA2. The second adhesive layer AL may be disposed between the second region AA2 and the second support layer PL2. The second adhesive layer AL may couple the display module DM and the second support layer PL2 to each other.

FIG. 7 illustrates that the first support layer PL1 and the second support layer PL2 are spaced apart from each other in the first direction DR1 as in FIGS. 2A and 2B. However, embodiments of the inventive concept are not limited thereto. The first support layer PL1 and the second support layer PL2 may have portions, respectively, which are coupled to each other as described with reference to FIGS. 2C and 2D, but embodiments are not limited thereto. In an embodiment, the first support layer PL1 and the second support layer PL2 include or are stainless steel. In an embodiment, the first support layer PL1 includes hole groups OP spaced apart from each other in the first direction DR1. Each of the hole groups OP may include first holes OP1 and second holes OP2. Each of the first holes OP1 and the second holes OP2 may be defined to pass through the first support layer PL1 from a front surface to a rear surface. For example, the first holes OP1 and the second holes OP2 may be through-holes.

Each of the first holes OP1 included in one hole group OP may extend in the second direction DR2, and the first holes OP1 may be spaced apart from each other in the second direction DR2. Each of the second holes OP2 may extend in the second direction DR2, and the second holes OP2 may be spaced apart from each other in the second direction DR2. The first holes OP1 included in the same hole group OP may be spaced apart from the second holes OP2 in the first direction DR1, and the first holes OP1 and the second holes OP2 may be arranged alternately with each other in the first direction DR1. In an embodiment, the second holes OP2 are shifted or offset from the first holes OP1 in the second direction DR2.

The multi-bars SB may be disposed at a lower portion of the first support layer PL1. Each of the multi-bars SB may extend in the second direction DR2. In an embodiment, the multi-bars SB are spaced apart from each other in the first direction DR1. Each of the multi-bars SB may further include joint portions disposed between adjacent multi-bars SB. The joint portions may guide the multi-bars SB such that a shape of the multi-bars SB is changed during the sliding operation of the display device DD.

The first adhesive layer OR may be spaced apart from the second adhesive layer AL in the first direction DR1. In an embodiment, the first adhesive layer OR includes an optically clear resin (OCR), and the second adhesive layer AL may include a pressure sensitive adhesive (PSA).

Since the first adhesive layer OR according to an embodiment of the inventive concept overlaps the first region AA1 that is changed in shape according to the sliding operation state, the first adhesive layer OR overlapping a region of the first support layer PL1, in which the first and second holes OP1 and OP2 are defined, and the first adhesive layer OR overlapping a region between the hole groups OP may have different physical properties.

For example, the region of the first support layer PL1, in which the first and second holes OP1 and OP2 are defined, may have relatively decreased rigidity compared to an adjacent region, and accordingly, a function of supporting the display module DM may be decreased. Thus, an adhesive layer having a relatively high modulus may be used as the first adhesive layer OR overlapping the region of the first support layer PL1, in which the first and second holes OP1 and OP2 are defined. On the other hand, the region between the hole groups OP may use an adhesive layer having a relatively low modulus so that the shape of the first support layer PL1 is easily changeable.

Figure 8:
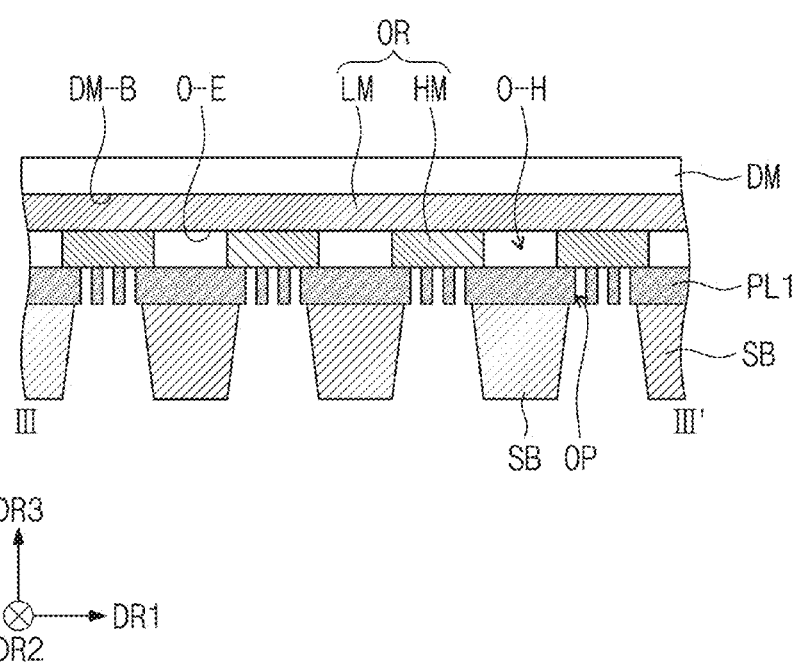
FIGS. 8 to 12 are cross-sectional views of the display device taken along line III-III' in FIG. 7.

Referring to FIG. 8, a first support layer PL1 may be disposed at a lower portion of a display module DM, which overlaps the first region AA1 (see FIG. 7). A first adhesive layer OR may be disposed between the first region AA1 (see FIG. 7) and the first support layer PL1. Multi-bars SB may be disposed at a lower portion of the first support layer PL1 and spaced apart from each other in the first direction DR1. For example, an upper surface of a multi-bar may contact a lower surface of the first support layer PL1. Each of the multi-bars SB may be disposed between adjacent hole groups OP. Thus, the multi-bars SB may be disposed in a region of the first support layer PL1, which has relatively high rigidity.

In an embodiment, the first adhesive layer OR includes a first resin layer LM and second resin layers HM. The first resin layer LM may be in contact with a rear surface DM-B of the display module DM, which overlaps the first region AA1 (see FIG. 7), and the second resin layers HM may be disposed on a rear surface of the first resin layer LM. Each of the second resin layers HM may extend in the second direction DR2, and the second resin layers HM may be spaced apart from each other in the first direction DR1. A single second resin layer HM may be disposed between adjacent hole groups OP.

In an embodiment, a predetermined space O-H is located between the first resin layer LM and the first support layer PL1 and between two adjacent second resin layers HM. Thus, the first resin layer LM may be spaced apart from the first support layer PL1 with the second resin layers HM therebetween.

In an embodiment, the second resin layers HM have a higher modulus than the first resin layer LM. For example, under −20° C. conditions, the modulus of the first resin layer LM may be about 300 kPa or less, and the modulus of the second resin layers HM may be about 500 kPa or less.

According to an embodiment of the inventive concept, the second resin layers HM of the first adhesive layer OR, which have a high modulus, overlap a portion of the first support layer PL1, which has relatively low rigidity due to the hole groups OP, thereby preventing sagging of the portion of the first support layer PL1, which has relatively low rigidity.

In an embodiment, a portion of the first adhesive layer OR, which overlaps each of the hole groups OP, is configured to have a thickness greater than a thickness of an adjacent region, thereby supplementing rigidity of the portion of the first support layer PL1, which is prone to a bending deformation. Thus, the display module DM disposed on the hole groups OP may be more stably supported.

Figure 9:
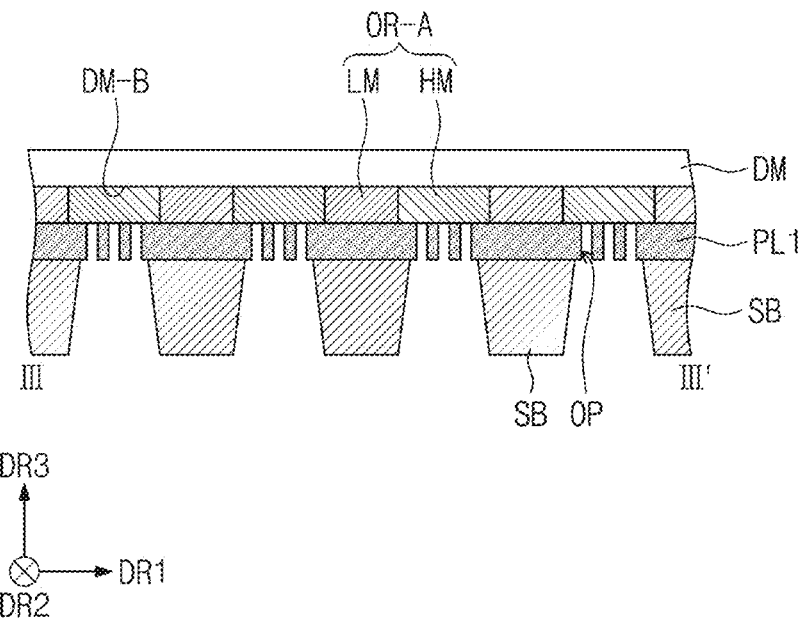

Referring to FIG. 9, a first support layer PL1 may be disposed at a lower portion of a display module DM, which overlaps the first region AA1 (see FIG. 7). A first adhesive layer OR-A may be disposed between the first region AA1 (see FIG. 7) and a first support layer PL1. Multi-bars SB may be disposed at a lower portion of the first support layer PL1 and spaced apart from each other in the first direction DR1. Each of the multi-bars SB may be disposed between adjacent hole groups OP. Thus, the multi-bars SB may be disposed in a region of the first support layer PL1, which has relatively high rigidity. In an embodiment, the first adhesive layer OR of FIG. 7 may be replaced with the first adhesive layer OR-A.

In an embodiment, the first adhesive layer OR-A includes first resin layers LM and second resin layers HM. In an embodiment, the second resin layers HM have a higher modulus than the first resin layers LM.

Each of the first resin layers LM may extend in the second direction DR2, and the first resin layers LM may be spaced apart from each other in the first direction DR1. In this embodiment, each of the first resin layers LM overlap a corresponding multi-bar SB. For example, a single one of the first resin layers LM may overlap a single one of the multi-bars SB.

Each of the second resin layers HM may extend in the second direction DR2, and the second resin layers HM may be spaced apart from each other in the first direction DR1. According to this embodiment, one second resin layer HM may be disposed between adjacent first resin layers LM. For example, a single second resin layer HM may be disposed between two of the first resin layers LM. In an embodiment, each of the second resin layers HM overlap a corresponding hole group OP.

In this embodiment, respective top surfaces of the first resin layers LM and the second resin layers HM define the same plane, and respective rear surfaces of the first resin layers LM and the second resin layers HM define the same plane. Thus, the top surface of each of the first resin layers LM and the second resin layers HM may be in contact with a rear surface DM-B of the display module DM, and the rear surface of each of the first resin layers LM and the second resin layers HM may be in contact with the first support layer PL1. For example, an upper surface of the first resin layers LM may be at a same level or height as an upper surface of the second resin layers HM, and a bottom surface of the first resin layers LM may be at a same level or height as a bottom surface of the second resin layers HM.

According to an embodiment of the inventive concept, each of the second resin layers HM of the first adhesive layer OR-A, which have a high modulus, overlap a portion of the first support layer PL1, which has relatively low rigidity due to the hole groups OP, thereby preventing sagging of the portion of the first support layer PL1, which has relatively low rigidity.

Figure 10:
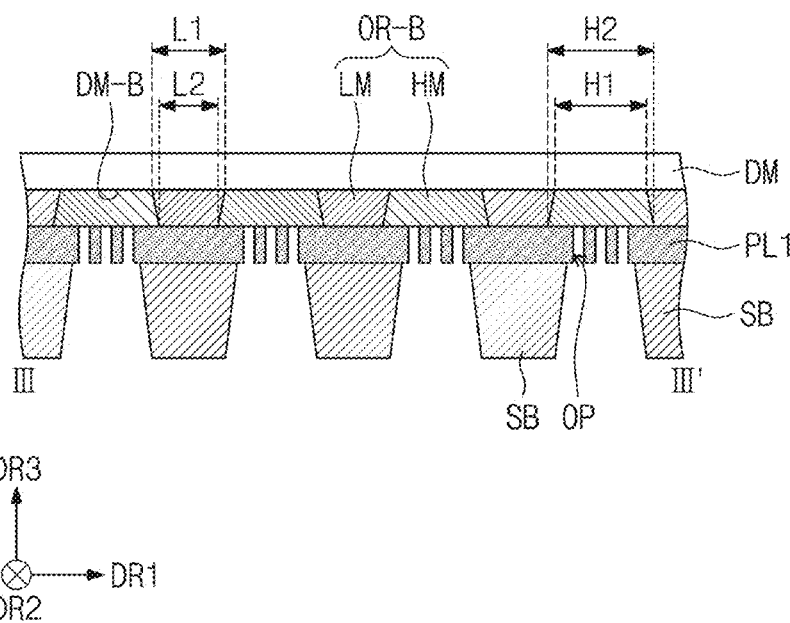

Referring to FIG. 10, a first support layer PL1 may be disposed at a lower portion of a display module DM, which overlaps the first region AA1 (see FIG. 7). A first adhesive layer OR-B may be disposed between the first region AA1 (see FIG. 7) and the first support layer PL1. Multi-bars SB may be disposed at a lower portion of the first support layer PL1 and spaced apart from each other in the first direction DR1. Each of the multi-bars SB may be disposed between adjacent hole groups OP. Thus, the multi-bars SB may be disposed in a region of the first support layer PL1, which has relatively high rigidity. In an embodiment, the first adhesive layer OR of FIG. 7 may be replaced with the first adhesive layer OR-B.

In an embodiment, the first adhesive layer OR-B includes first resin layers LM and second resin layers HM. In an embodiment, the second resin layers HM has a higher modulus than the first resin layers LM.

Each of the first resin layers LM may extend in the second direction DR2, and the first resin layers LM may be spaced apart from each other in the first direction DR1. In this embodiment, each of the first resin layers LM may overlap a corresponding multi-bar SB.

Each of the second resin layers HM may extend in the second direction DR2, and the second resin layers HM may be spaced apart from each other in the first direction DR1. According to this embodiment, a single second resin layer HM is disposed between adjacent first resin layers LM. For example, a single second resin layer HM may be disposed between two first resin layer LM. Each of the second resin layers HM may overlap a corresponding hole group OP.

In an embodiment, each of the first resin layers LM and the second resin layers HM have a top surface in contact with a rear surface DM-B of the display module DM, a rear surface in contact with the first support layer PL1, and side surfaces, each of which connects the top surface and the rear surface to each other. Each of the side surfaces may be inclined from each of corresponding top and rear surfaces at a predetermined angle.

For example, each of the first resin layers LM may have an acute angle between the top surface and one side surface, and an obtuse angle between the rear surface and one side surface in a cross-sectional view. In an embodiment, the top surface of the first resin layer LM has a first width L1 in the first direction DR1, and the rear surface of the first resin layer LM has a second width L2 smaller than the first width L1 in the first direction DR1. Thus, each of the first resin layers LM may have an inverted trapezoidal shape in a plan view.

According to an embodiment, each of the second resin layers HM have an obtuse angle between the top surface and one side surface, and an acute angle between the rear surface and one side surface in a cross-sectional view. In an embodiment, the top surface of the second resin layer HM has a first width H1 in the first direction DR1, and the rear surface of the second resin layer HM has a second width H2 greater than the first width H1 in the first direction DR1. Thus, each of the second resin layers HM may have a trapezoidal shape in a plan view.

The respective top surfaces of the first resin layers LM and the second resin layers HM may define the same plane, and the respective rear surfaces of the first resin layers LM and the second resin layers HM may define the same plane. Thus, the top surface of each of the first resin layers LM and the second resin layers HM may be in contact with a rear surface DM-B of the display module DM, and the rear surface of each of the first resin layers LM and the second resin layers HM may be in contact with the first support layer PL1.

Only differences from FIG. 10 are described with reference to FIG. 11. In an embodiment, a first adhesive layer OR-C includes first resin layers LM and second resin layers HM. In an embodiment, the second resin layers HM has a higher modulus than the first resin layers LM. In an embodiment, the first adhesive layer OR of FIG. 7 may be replaced with the first adhesive layer OR-C.

Each of the first resin layers LM may extend in the second direction DR2, and the first resin layers LM may be spaced apart from each other in the first direction DR1. In this embodiment, each of the first resin layers LM may overlap a corresponding multi-bar SB.

Each of the second resin layers HM may extend in the second direction DR2, and the second resin layers HM may be spaced apart from each other in the first direction DR1. According to this embodiment, a single second resin layer HM is disposed between adjacent first resin layers LM. For example, a single resin layer HM may be disposed between two of the first resin layer LM. Each of the second resin layers HM may overlap a corresponding hole group OP.

In an embodiment, each of the first resin layers LM and the second resin layers HM have a top surface in contact with a rear surface DM-B of the display module DM, a rear surface in contact with the first support layer PL1, and side surfaces, each of which connects the top surface and the rear surface to each other. Each of the side surfaces may be inclined from each of corresponding top and rear surfaces at a predetermined angle.

For example, each of the first resin layers LM may have an obtuse angle between the top surface and one side surface, and an acute angle between the rear surface and one side surface in a cross-sectional view. The top surface of the first resin layer LM may have a first width L1 in the first direction DR1, and the rear surface of the first resin layer LM may have a second width L2 greater than the first width L1 in the first direction DR1. Thus, each of the first resin layers LM may have a trapezoidal shape in a plan view.

According to an embodiment, each of the second resin layers HM have an acute angle between the top surface and one side surface, and an obtuse angle between the rear surface and one side surface in a cross-sectional view. In an embodiment, the top surface of the second resin layer HM has a first width H1 in the first direction DR1, and the rear surface of the second resin layer HM has a second width H2 smaller than the first width H1 in the first direction DR1. Thus, each of the second resin layers HM may have an inverted trapezoidal shape in a plan view.

Figure 12:
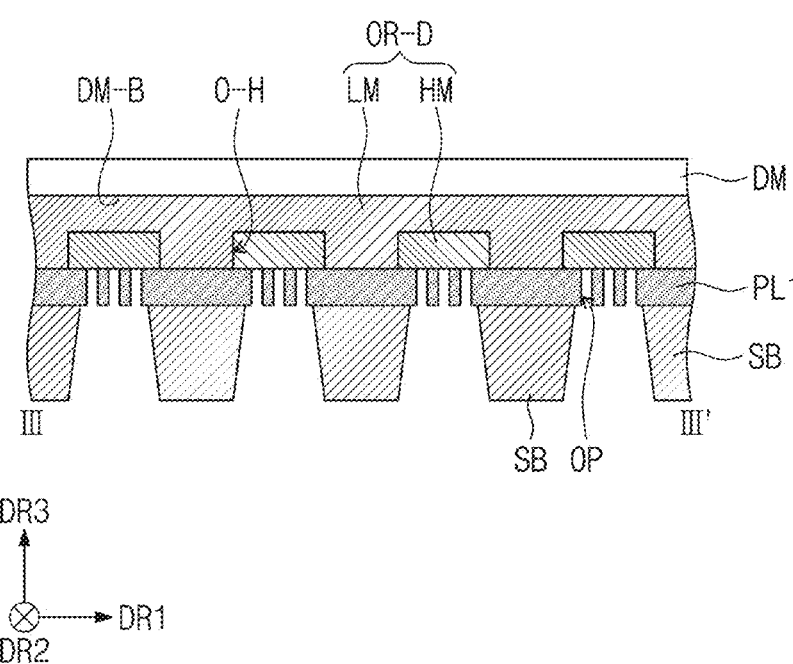

Referring to FIG. 12, a first adhesive layer OR-D according to an embodiment is disposed between a rear surface DM-B of a display module DM and a first support layer PL1, which overlap the first region AA1. In an embodiment, the first adhesive layer OR of FIG. 12 may be replaced with the first adhesive layer OR-D.

In this embodiment, the first adhesive layer OR-D includes a first resin layer LM and second resin layers HM. In an embodiment, the second resin layers HM have a higher modulus than the first resin layer LM.

Hole patterns O-H may be defined in the first resin layer LM. Each of the hole patterns O-H may overlap a corresponding hole group OP.

Each of the second resin layers HM may extend in the second direction DR2, and the second resin layers HM may be disposed in the first resin layer LM. For example, each of the second resin layers HM may be disposed in a corresponding hole pattern O-H.

According to an embodiment, rear surfaces of the second resin layers HM, which are exposed from the hole patterns O-H, respectively, and a rear surface of the first resin layer LM define the same plane. Thus, the rear surfaces of the second resin layers HM, which are exposed from the hole patterns O-H, respectively, and the rear surface of the first resin layer LM may be in contact with the first support layer PL1. However, embodiments of the inventive concept are not limited thereto. For example, the second resin layers HM may be disposed inside the first resin layer LM and surrounded by the first resin layer LM. In this embodiment, the second resin layers HM are not exposed to the outside.

Figure 13A:
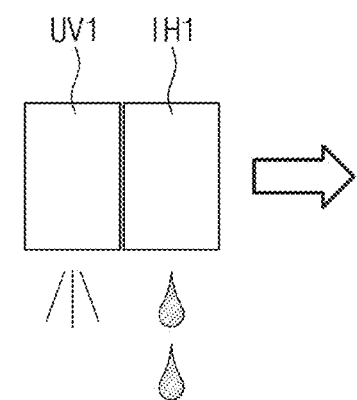
FIGS. 13A and 13B are cross-sectional views of a method of manufacturing a display device according to an embodiment of the inventive concept.
Figure 13A:
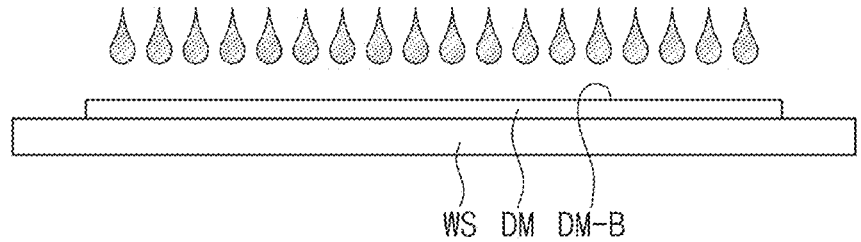
Figure 13B:
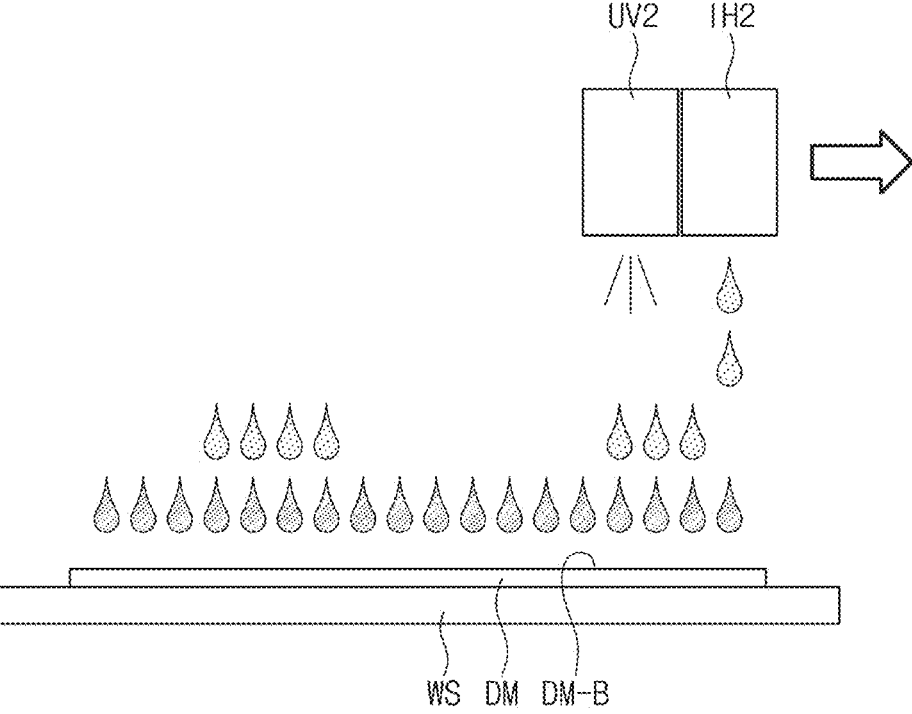
Figure 14:
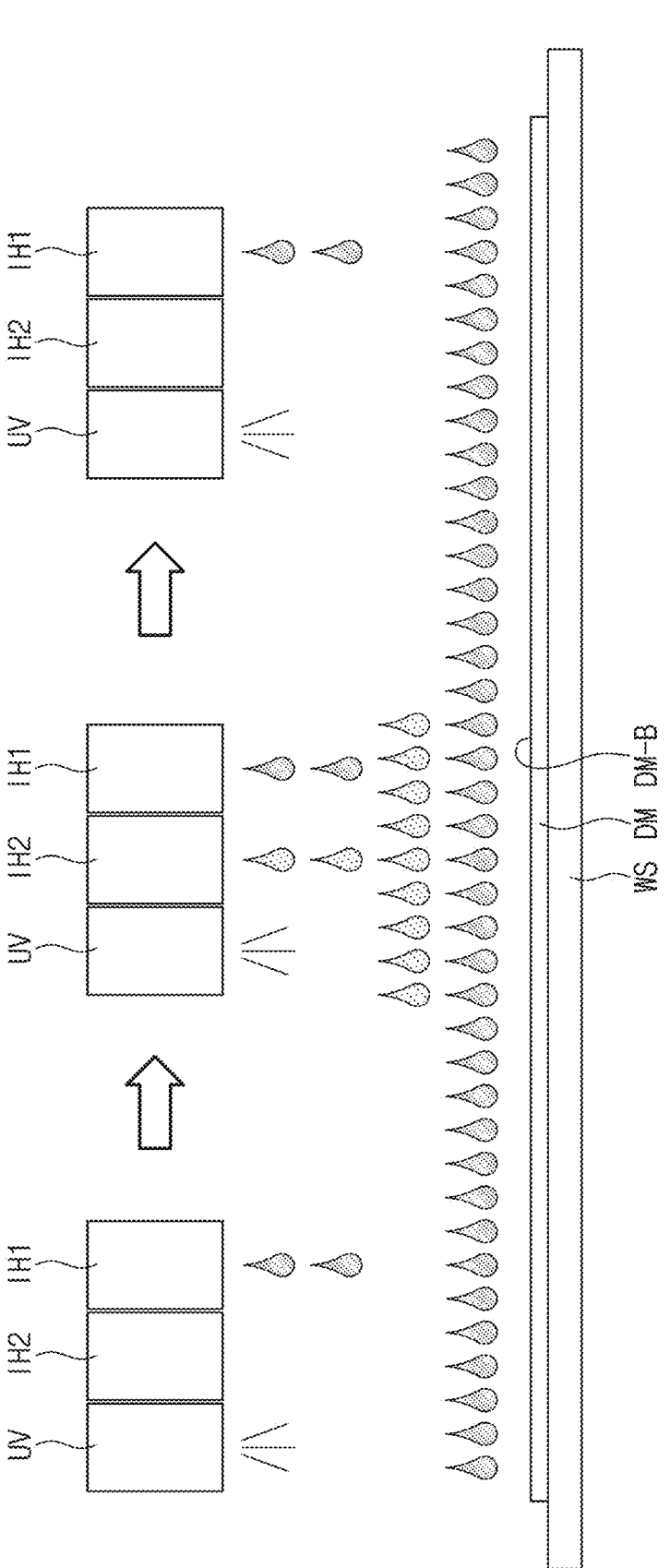
FIG. 14 is a cross-sectional view of a method of manufacturing a display device according to an embodiment of the inventive concept.
Figure 15A:
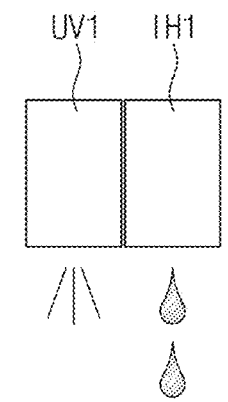
FIGS. 15A and 15B are cross-sectional views of a method of manufacturing a display device according to an embodiment of the inventive concept.
Figure 15A:
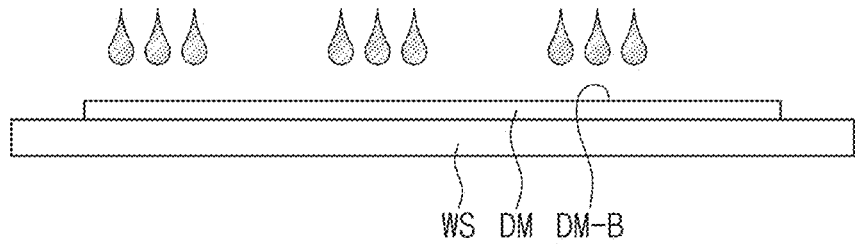
Figure 15B:
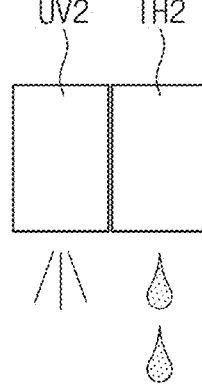
Figure 15B:
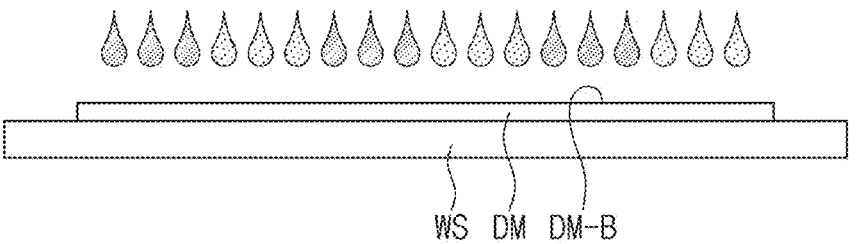

FIGS. 13A and 13B are cross-sectional views of a method of manufacturing a display device according to an embodiment of the inventive concept. FIG. 14 is a cross-sectional view of a method of manufacturing a display device according to an embodiment of the inventive concept. FIGS. 15A and 15B are cross-sectional views of a method of manufacturing a display device according to an embodiment of the inventive concept. The same/similar components as/to those described with reference to FIGS. 1A to 12 are denoted as the same/similar reference numbers or symbols, and duplicate description is omitted.

Referring to FIG. 13A, the method of manufacturing the display device according to an embodiment includes providing or forming a work substrate WS on which a display module DM is disposed. The display module DM may be disposed so that a rear surface DM-B faces a first head IH1. The display module DM may be divided into the folding region and the peripheral region, which are described above. The folding region may correspond to the first region AA1 described with reference to FIG. 7, and the peripheral region may correspond to each of the second region AA2 and the third region AA3 described with reference to FIG. 7. Hereinafter, the rear surface DM-B of the display module DM, which will be described with reference to FIGS. 13A to 15B, may correspond to the folding region.

Then, the method of manufacturing the display device according to an embodiment includes applying a first adhesive material. The first adhesive material may include an optically clear resin (OCR). The first adhesive material may be applied onto the rear surface DM-B of the display module DM by the first head IH1. The applying of the first adhesive material by the first head IH1 may be carried out by using an inkjet method. Thus, the first adhesive material may be dropped at a set position through a nozzle included in the first head IH1. According to an embodiment, the first adhesive material is applied onto the entirety of the rear surface DM-B of the display module DM.

Thereafter, the method of manufacturing the display device according to an embodiment may include curing the first adhesive material to form the first resin layer LM (see FIG. 8). The curing of the first adhesive material may be carried out through a first curing machine UV1. The first curing machine UV1 may be an ultraviolet (UV) curing machine that emits UV light. The first curing machine UV1 may be coupled to the first head IH1 to move with the first head IH1 as one body. Thus, the dropping of the first adhesive material by the first head IH1 and the curing of the first adhesive material, which is applied on the rear surface DM-B of the display module DM, by the first curing machine UV1 may be carried out at the same time.

Then, referring to FIGS. 13B, the method of manufacturing the display device according to an embodiment includes applying a second adhesive material. The second adhesive material may include an optically clear resin (OCR). According to an embodiment of the inventive concept, the second adhesive material has a higher modulus than the first adhesive material. For convenience of explanation, the first adhesive material and the second adhesive material are illustrated in different hatchings.

The second adhesive material may be applied onto the rear surface DM-B of the display module DM by a second head IH2. The applying of the second adhesive material by the second head IH2 may be carried out by using an inkjet method. Thus, the second adhesive material may be dropped at a set position through a nozzle included in the second head IH2. According to an embodiment, the second adhesive material is applied onto the first resin layer LM (see FIG. 8) in a fixed amount at predetermined intervals. For example, as shown in FIG. 13B, the second adhesive material is not dropped onto all points in which the first adhesive material is dropped.

Thereafter, the method of manufacturing the display device according to an embodiment may include curing the second adhesive material to form the second resin layers HM (see FIG. 8). The curing of the second adhesive material may be carried out through a second curing machine UV2. The second curing machine UV2 may be a UV curing machine. The second curing machine UV2 may be coupled to the second head IH2 to move with the second head IH2 as one body. Thus, the dropping of the second adhesive material by the second head IH2 and the curing of the second adhesive material, which is applied on the first resin layer LM (see FIG. 8), by the second curing machine UV2 may be carried out at the same time.

Referring to FIG. 14, a method of manufacturing the display device according to an embodiment includes providing or forming a work substrate WS, on which a display module DM is disposed, applying a first adhesive material, applying a second adhesive material, and curing at least one of the first adhesive material or the second adhesive material.

According to this embodiment, a first head IH1, which applies the first adhesive material, a second head IH2, which applies the second adhesive material, and a curing machine UV may be coupled to each other to move as one body.

Thus, while the first adhesive material is dropped onto a rear surface DM-B of a display module DM through the first head IH1, the first adhesive material applied on the rear surface DM-B of the display module DM may be cured to form the first resin layer LM (see FIG. 8), and in the same process, the second adhesive material may be applied onto the first resin layer LM (see FIG. 8) at predetermined intervals through the second head IH2. Thereafter, the second adhesive material may be cured through the curing machine UV to form second resin layers HM in the same process. For example, there will be times when only the first adhesive material is dropped and other times when both the first adhesive material and the second adhesive material is dropped.

An adhesive layer formed through the process described with reference to FIGS. 13A and 13B or FIG. 14 may correspond to the first adhesive layer OR described with reference to FIG. 8 or the first adhesive layer OR-D described with reference to FIG. 12. The first adhesive layer OR-D described with reference to FIG. 12 may be formed by applying the first adhesive material to have a relatively small thickness onto a region corresponding to the hole pattern O-H (see FIG. 12) in the applying of the first adhesive material, followed by curing, and then applying the second adhesive material onto the first resin layer LM (see FIG. 12) formed to be thin.

In a method of manufacturing the display device according to an embodiment, the adhesive layer disposed in a region, which is changed in shape during the sliding operation of the display device DD (see FIG. 1A), is formed of the adhesive material including an optically clear resin (OCR). Accordingly, the method may manufacture a display device with reduced costs as compared to a method of manufacturing a display that includes forming an adhesive layer constituted by a plurality of layers, each of which includes a pressure sensitive adhesive (PSA).

Referring to FIG. 15A, a method of manufacturing a display device according to an embodiment includes providing or forming a work substrate WS, on which a display module DM is disposed, applying a first adhesive material, applying a second adhesive material, and curing at least one of the first adhesive material or the second adhesive material.

The first adhesive material may be applied onto a rear surface DM-B of a display module DM by a first head IH1. The first adhesive material may be applied onto the rear surface DM-B of the display module DM in a fixed amount at predetermined intervals. For example, the first adhesive material is not dropped onto all points of the rear surface DM-B.

Figure 11:
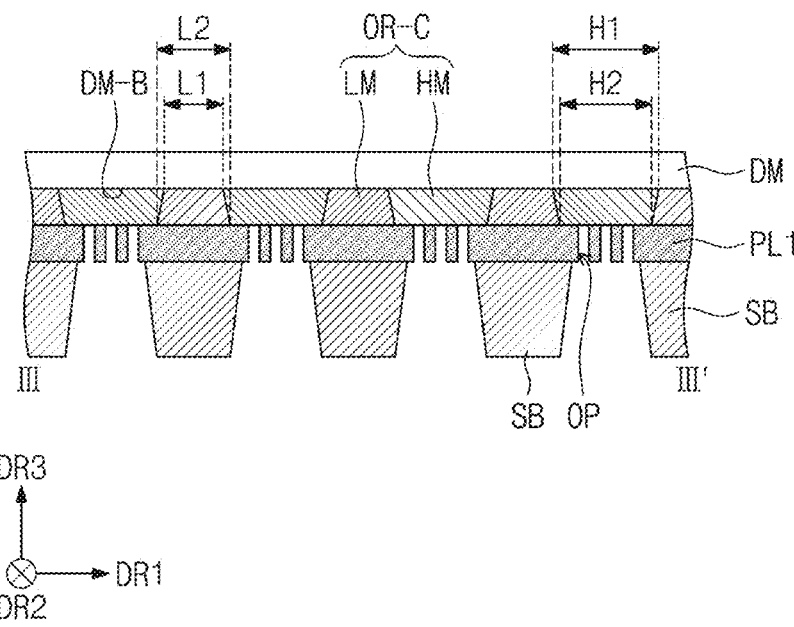

The method of manufacturing a display according to an embodiment may include curing the first adhesive material to form the first resin layers LM (see FIGS. 9 to 11). The first resin layers LM (see FIGS. 9 to 11) may be spaced a predetermined gap from each other. For example, portions of the first resin layer LM may be spaced apart from one another.

The curing of the first adhesive material may be carried out through a first curing machine UV1. The first curing machine UV1 may be a UV curing machine. The first curing machine UV1 may be coupled to the first head IH1 to move with the first head IH1 as one body. Thus, dropping of the first adhesive material by the first head IH1 and the curing of the first adhesive material, which is applied on the rear surface DM-B of the display module DM, by the first curing machine UV1 may be carried out at the same time.

The second adhesive material may be applied onto the rear surface DM-B of the display module DM by a second head IH2. The second adhesive material may be applied between the first resin layers LM (see FIGS. 9 to 11) spaced a predetermined gap from each other. For example, the second adhesive material may be dropped onto locations of the read surface DM-B not occupied by the first adhesive material.

The method manufacturing the display according to an embodiment may include curing the second adhesive material to form the second resin layers HM (see FIGS. 9 to 11). The second resin layers HM (see FIGS. 9 to 11) may be spaced a predetermined gap from each other. One second resin layer HM may be formed between adjacent first resin layers LM. For example, a single one of the second resin layers HM may be formed between two of the first resin layers LM.

The curing of the second adhesive material may be carried out through a second curing machine UV2. The second curing machine UV2 may be a UV curing machine. The second curing machine UV2 may be coupled to the second head IH2 to move with the second head IH2 as one body. Thus, dropping of the second adhesive material by the second head IH2 and the curing of the second adhesive material, which is applied between the first resin layers LM (see FIGS. 9 to 11), by the second curing machine UV2 may be carried out at the same time.

An adhesive layer formed through the process described with reference to FIGS. 15A and 15B may correspond to each of the first adhesive layers OR-A, OR-B and OR-C described with reference to FIGS. 9 to 11.

According to an embodiment of the inventive concept, rigidity of a portion of a support layer, which is prone to a deformation during a sliding operation, is supplemented, and a thickness of an adhesive layer disposed at a portion prone to a bending deformation is increased, thereby providing a display device having a sliding operation with increased durability.

In addition, an adhesive layer of the display device disposed at a portion that is changed in shape during the sliding operation may be formed of an optically clear insulating material, thereby providing a display device manufacturing method with reduced costs.

Although embodiments of the present inventive concept have been described, it is understood that the present invention should not be limited to these embodiments but various changes and modifications can be made by one ordinary skilled in the art within the spirit and scope of the present invention as hereinafter claimed.

What is claimed is:

1. A display device comprising:

a display module including a first region, a second region, and a third region arranged in a first direction;

a first support layer including hole groups, each of which includes a plurality of holes and which are spaced apart from each other in the first direction, and disposed under the display module to overlap the first region;

a first adhesive layer disposed between the first region and the first support layer;

a second support layer disposed under the display module to overlap the second region;

a second adhesive layer disposed between the second region and the second support layer; and multi-bars, which are disposed under the first support layer and spaced apart from each other in the first direction and each of which extends in a second direction crossing the first direction, wherein the first adhesive layer includes at least one first resin layer, and second resin layers, wherein each of the second resin layers overlap a corresponding hole group among the hole groups and has a higher modulus than the first resin layer.

2. The display device of claim 1, wherein the first adhesive layer comprises an optically clear resin (OCR), and the second adhesive layer comprises a pressure sensitive adhesive (PSA).

3. The display device of claim 1, wherein each of the multi-bars is disposed between two of the hole groups of the first support layer, which are adjacent to each other in the first direction.

4. The display device of claim 3, wherein:

the at least one first resin layer is in contact with a rear surface of the display module, which overlaps the first region; and each of the second resin layers extends in the second direction, and the second resin layers are spaced apart from each other in the first direction.

5. The display device of claim 4, wherein:

the second resin layers are disposed on a rear surface of the at least one first resin layer; and a predetermined space is present between the at least one first resin layer and the first support layer and between the second resin layers adjacent to each other.

6. The display device of claim 5, wherein the at least one first resin layer is spaced apart from the first support layer with the second resin layers therebetween.

7. The display device of claim 4, wherein:

the second resin layers are disposed in the at least one first resin layer; and a rear surface of the at least one first resin layer and a rear surface of each of the second resin layers, which is exposed on the rear surface of the at least one first resin layer, are in contact with the first support layer.

8. The display device of claim 3, wherein:

the at least one first resin layer is provided in plurality, each of the first resin layers extends in the second direction, and the first resin layers are spaced apart from each other in the first direction and overlap corresponding multi-bars, respectively, among the multi-bars; and each of the second resin layers is disposed between the first resin layers adjacent to each other.

9. The display device of claim 8, wherein:

each of the first resin layers and the second resin layers has a first surface in contact with a rear surface of the display module, a second surface in contact with the first support layer, and side surfaces, each of which connects the first surface and the second surface to each other; and each of the first resin layers and the second resin layers has a trapezoidal shape in a cross-sectional view.

10. The display device of claim 9, wherein:

the first surface of each of the first resin layers has a width smaller than a width of the second surface of each of the first resin layers in a cross-sectional view; and the first surface of each of the second resin layers has a width greater than a width of the second surface of each of the second resin layers in a cross-sectional view.

11. The display device of claim 9, wherein:

the first surface of each of the first resin layers has a width greater than a width of the second surface of each of the first resin layers in a cross-sectional view; and the first surface of each of the second resin layers has a width smaller than a width of the second surface of each of the second resin layers in a cross-sectional view.

12. The display device of claim 1, wherein:

the first region of the display module, the first adhesive layer, and the first support layer are folded with respect to a rotary axis extending in the second direction; and the multi-bars guide a folding operation of the first support layer.

13. The display device of claim 1, wherein, under −20° C. conditions, the first resin layer has a modulus of about 300 kPa or less, and the second resin layers has a modulus of about 500 kPa or less.

14. The display device of claim 1, wherein each of the first support layer and the second support layer comprises stainless steel.

15. The display device of claim 1, wherein each of the hole groups comprises first holes, each of which extends in the second direction and which are spaced apart from each other in the second direction, and second holes which are spaced apart from the first holes in the first direction and spaced apart from each other in the second direction and each of which extends in the second direction, wherein the first holes and the second holes are arranged alternately with each other in the first direction, and the second holes are shifted from the first holes in the second direction.

16. The display device of claim 1, wherein:

the third region is configured to be bent with respect to a virtual axis extending in the second direction; and the display device further comprises a circuit board disposed in the third region.

* * * * *